(12) United States Patent
DeLouise

(10) Patent No.: US 9,346,197 B2
(45) Date of Patent: May 24, 2016

(54) MICROFLUIDIC DEVICE AND METHOD OF MANUFACTURING THE MICROFLUIDIC DEVICE

(75) Inventor: Lisa A. DeLouise, Rochester, NY (US)

(73) Assignee: University of Rochester, Rochester, NY (US)

( * ) Notice: Subject to any disclaimer, the term of this patent is extended or adjusted under 35 U.S.C. 154(b) by 407 days.

(21) Appl. No.: 13/304,843

(22) Filed: Nov. 28, 2011

(65) Prior Publication Data

US 2012/0070886 A1 Mar. 22, 2012

Related U.S. Application Data

(63) Continuation-in-part of application No. 12/139,797, filed on Jun. 16, 2008, now abandoned.

(60) Provisional application No. 60/929,128, filed on Jun. 14, 2007.

(51) Int. Cl.
*B29C 41/50* (2006.01)
*B01L 3/00* (2006.01)
*B81C 1/00* (2006.01)

(52) U.S. Cl.
CPC ........... *B29C 41/50* (2013.01); *B01L 3/502707* (2013.01); *B81C 1/00119* (2013.01); *B01L 3/502761* (2013.01); *B01L 2200/0642* (2013.01); *B01L 2200/0668* (2013.01); *B01L 2300/0654* (2013.01); *B01L 2300/0819* (2013.01); *B01L 2300/161* (2013.01); *B81B 2201/058* (2013.01); *B81B 2203/0376* (2013.01)

(58) Field of Classification Search
CPC ................. B01L 3/502761; B01L 2300/0829; B01L 3/502707; B01L 3/5027; B29C 41/50
See application file for complete search history.

(56) References Cited

U.S. PATENT DOCUMENTS

| | | |
|---|---|---|
| 5,578,238 A | 11/1996 | Weiss |
| 6,326,211 B1 | 12/2001 | Anderson et al. |
| 6,627,433 B2 * | 9/2003 | Frazier et al. ............. 435/288.7 |
| 6,835,773 B2 * | 12/2004 | Kratzmeier ................. 524/813 |
| 6,969,166 B2 | 11/2005 | Clark et al. |
| 8,151,600 B2 * | 4/2012 | Eklund et al. .................. 65/106 |
| 2003/0124623 A1 | 7/2003 | Yager et al. |
| 2004/0063214 A1 * | 4/2004 | Berlin et al. ................... 436/94 |
| 2004/0163958 A1 | 8/2004 | Kao et al. |
| 2005/0202470 A1 | 9/2005 | Sundberg et al. |

OTHER PUBLICATIONS

Gottwald et al., "A chip-based platform for the in vitro generation of tissues in three-dimensional organization", Apr. 2007, Lab Chip, 7, pp. 777-785.*

(Continued)

*Primary Examiner* — Jonathan Hurst
(74) *Attorney, Agent, or Firm* — LeClairRyan, a Professional Corporation

(57) ABSTRACT

A microfluidic device having a substrate with an array of curvilinear cavities. The substrate of the microfluidic device is preferably fabricated of a polymer such as polydimethylsiloxane (PDMS). The microfluidic device is manufactured using a gas expansion molding (GEM) technique.

18 Claims, 26 Drawing Sheets

(56) References Cited

OTHER PUBLICATIONS

Giang et al., "Microfabrication of cavities in polydimethylsiloxane using DRIE silicon molds", Oct. 2007, Lab Chip, 7(12), pp. 1660-1662.*

Lee W. Young; Patent Cooperation Treaty PCT International Search Report for PCT/US08/67101; Form PCT/ISA/210; 2 pages.

Lee W. Young; Patent Cooperation Treaty PCT Written Opinion of the International Search Authority for PCT/US08/67101; Form PCT/ISA/237; 6 pages.

Shih-Hui Chao et al.; Rapid fabrication of microchannels using microscale plasma activated templating (μPLAT) generated water molds; The Royal Society of Chemistry 2007; Lab Chip, 2007, 7, 641-643.

Chih-Yuan Chang et al.; Fabrication of polymer microlens arrays using capillary forming with a soft mold of microholes array and UV-curable polymer; Optical Society of America; Jun. 26, 2006, vol. 14, No. 13/Optics Express; pp. 6253-6258.

* cited by examiner

US 9,346,197 B2

MICROFLUIDIC DEVICE AND METHOD OF MANUFACTURING THE MICROFLUIDIC DEVICE

CROSS-REFERENCE TO RELATED APPLICATIONS

This application is a continuation-in-part of U.S. patent application Ser. No. 12/139,797, filed on Jun. 16, 2008 and entitled "Microfluidic Device and Method of Manufacturing the Microfluidic Device" and claiming priority to U.S. Provisional Patent Application Ser. No. 60/929,128, filed Jun. 14, 2007, both of which are hereby incorporated by reference in their entireties.

FIELD OF THE INVENTION

The present invention relates generally to microfluidics, and more particularly, to a microfluidic device and a method of manufacturing the microfluidic device.

BACKGROUND

Microfluidics technology is used in microfluidic devices such as lab-on-a-chip systems ("LOC"), which separate or mix fluids and perform biochemical reactions using the separated or mixed fluids. Microfluidic devices are also used to sort cells and provide a means to conduct single cell assays. Microfluidic devices include a substrate on which channels and chambers are formed. Soft lithography methods employing polymer-molding to generate LOC devices has enabled considerable innovation in the application of microfluidic devices for cell sorting and microcell culture. Precise control over laminar flow streams has enabled the selective spatial exposure of bioactive agents to cells and the investigation of mechanotransduction and cell response to shear stress under laminar or pulsitile flows. Many challenges exist however, to creating a technology platform that can sort cells from a diverse population, maintain them in culture, uniformly direct their fate (e.g., differentiation, elimination) and interrogate cell signaling responses in situ as a function of cell density.

Parallel-plate microchannel systems employing physical features (pillars) and adhesive interactions have proven useful in cell separation. The pillars are generally fabricated by a reverse molding technique. FIG. 1 is directed to a prior art method 10 used to fabricate pillar arrays. A silicon wafer 12 is provided. Deep reactive ion etching (DRIE) is used to make pits 14 in silicon wafer 12. A hydrophobic material is coated onto silicon wafer mold 12 for easy removal of PDMS after it has been cured. PDMS 16 is cast onto the hydrophobic silicon wafer 12 as shown in Step (a). In Step (b), the standard practice is to apply a vacuum to degas PDMS 16 and deplete trapped gas, for example, air, nitrogen, helium and/or argon, in pits 14 and dissolved in PDMS 16. PDMS 16 is then cured for example at 100° C. for two hours as shown in Step (c). The reverse molded pillar array 18 is removed from silicon wafer mold 12.

FIG. 2 shows a pillar array for use in cell separation. The disadvantage of pillar arrays is that, over time, as the adherent cell number builds, the microchannel hydrodynamic resistance and flow velocity can change. Devices can become clogged.

It is a primary object of the invention to provide a microfluidic device that can integrate cell sorting, microcell culture and real time diagnostics. It is another object of the invention to provide a microfluidic device that is applicable for use in diagnostic, therapeutic and investigative research, particularly in the areas of sorting rare cells and investigating stem cell and cancer cell biology. It is a further object of the invention to provide a facile and effective method of manufacturing microfluidic devices incorporating structures with novel geometries.

BRIEF SUMMARY OF THE INVENTION

These and other objects and advantages are accomplished by a microfluidic device. In one embodiment, the microfluidic device has a substrate with a plurality of curvilinear cavities. Each curvilinear cavity has an inner surface that curves outward from a rounded bottom located at a point furthest from the opening of the cavity to a maximum diameter, and then curves inward from the point of the maximum diameter to the opening. The maximum diameter of the inner surface is variable but the preferred embodiment has a maximum diameter of the inner surface greater than the diameter of the opening. In one embodiment, the ratio of the maximum diameter to the diameter of the opening is greater than 1. The maximum diameter can be, for example, approximately 60 to 200 microns, and the diameter of the opening can be, for example, approximately 150 to 350 microns. The curvilinear cavities lack an edge other than the opening, and can be spherical, oblong, oval or any other curved shape.

In one embodiment, the curvilinear cavities are provided in a variety of different arrays such as in evenly spaced rows or in staggered rows. The cavities may be all of the same size, all of the same shape, of varied sizes, and/or of varied shapes. The cavities may be spaced at a distance in a range of about two times the diameter of the opening of the cavities to about ten times the diameter of the opening of the cavities. The cavities may be fused to form of a linear tubular cavity or obtuse shaped cavity.

In another embodiment, the substrate of the microfluidic device is preferably fabricated of a polymer such as polydimethylsiloxane (PDMS). Other examples include, but are not limited to, polysiloxanes, a carbon-based polymers, polyacrylamides, polyacrylates, polymethacrylates or mixtures thereof.

In yet another embodiment, the cavities comprise a coating for selective capture of cells. The coating may provide a microenvironment beneficial for the culture of specific cells. The coating may comprise protein or biochemicals. The coating may be deposited by vacuum-assisted deposition. Examples of the coating include, but are not limited to, antibodies (IgG, IgM, IgE etc), selectins, collagens, fibronectins, chemoattractants, signaling molecules, antigens, ligands, and/or biochemicals.

In yet another embodiment, the microfluidic device may have one or more sensors embedded therein. The sensors may be embedded in the substrate below the cavity or in the cavity, itself. An example of a sensor is a porous silicon optical sensor.

In another embodiment, a method of manufacturing a microfluidic device using a gas expansion molding (GEM) technique is provided. A wafer mold is etched to provide one or more pits therein. A polymer premix is applied onto the wafer mold, covering the one or more pits to create an interface between the polymer layer and the wafer. The wafer with said polymer premix layer thereon sits for a period of time at room temperature to allow the premix to self level and to allow dissolved gas, for example, air, nitrogen, helium, and/or argon to rise to the air premix interface. When the polymer is cured the gas dissolved in the premix and trapped in the one or more pits expands. Gas trapped in the pit forms a meniscus in the polymer premix. The curing process may allow gas trapped in the polymer to diffuse. The gas may combine with gas trapped in one or more pits. As the polymer is cured, the gas at the polymer-wafer interface expands to create microbubbles. Residual gas trapped in the polymer diffuses to enhance bubble growth. The cured polymer has cavities formed therein where the microbubbles had formed. The cavity size and shape depends on the mold parameters and process conditions. The polymer substrate having the cavities is separated from the wafer for use as a microfluidic bio or chemical reactor.

In a further embodiment, the step of allowing the wafer with the polymer layer thereon to sit is conducted for about 10 to about 60 minutes at a temperature in the range of about 20 to about 200° C. A preferred curing temperature range is from about 65 to about 100° C.

In yet a further embodiment, the polymer is applied at a thickness in the range of about 0.1 to about 5000 microns. The polymer may be cured at a temperature in the range of about 20 to about 200° C.

In another embodiment, the wafer is coated with a hydrophobic material prior to the step of applying the polymer layer onto the wafer. Examples of hydrophobic materials include, but are not limited to, silane and fluorinated polymer coatings, such as Teflon. The coating may be produced by gas plasma deposition or chemical surface functionalization. The chemical surface functionalization may use alkoxy coupling agents comprising silanes, titanates, zirconates and zircoaluminates. Examples of silanes include, but are not limited to, 1H- or 2H-perfluoro-decyltrichlorosilane. A preferred coating is a Teflon-like fluoropolymer produced by plasma processes.

In yet a further embodiment, the pits are provided in an array comprising pits in evenly spaced rows, pits in staggered rows, pits of the same size, pits of the same shape, pits of varied sizes; and/or pits of varied shapes. The shapes of the pits include, but are not limited to, polygonal, circular, oval, and oblong cross-section. The polygonal cross-section may include, but is not limited to, triangular, square, rectangular, hexagonal or octagonal cross-section.

In a further embodiment, the pits may have a depth in the range from about 10 microns to about 500 microns. A preferred depth is in the range of from about 50 microns to about 150 microns.

In a further embodiment, the pits are positioned at a distance to create separate microbubbles or curvilinear cavities. The pits may be spaced at a distance in the range of about two times the diameter of the opening of the pit to about ten times the diameter of the opening of the pit. The pits may be spaced at a distance in the range of about 50 to about 500 microns.

In still another embodiment, the pits may be positioned at a distance to create fused microbubbles or curvilinear cavities. The fused microbubbles or curvilinear cavities may create a single, linear tubular cavity.

In yet another embodiment, the cavities may be coated with a protein or with biochemicals for selective capture of cells. The coating may be applied by vacuum-assisted deposition. The coating may comprise but is not limited to antibodies (IgG, IgM, IgE etc), selectins, collagens, fibronectins, chemoattractants, signaling molecules, antigens, ligands, and/or biochemicals.

BRIEF DESCRIPTION OF THE DRAWINGS

The present invention will be more fully understood and appreciated by reading the following Detailed Description in conjunction with the accompanying drawings, in which.

DETAILED DESCRIPTION

As will be appreciated, the embodiments of the present invention include a microfluidic device and a method of manufacture thereof. The microfluidic device is very useful for cell sorting, microcell culture and diagnostics in a single integrated device.

Figure 1:
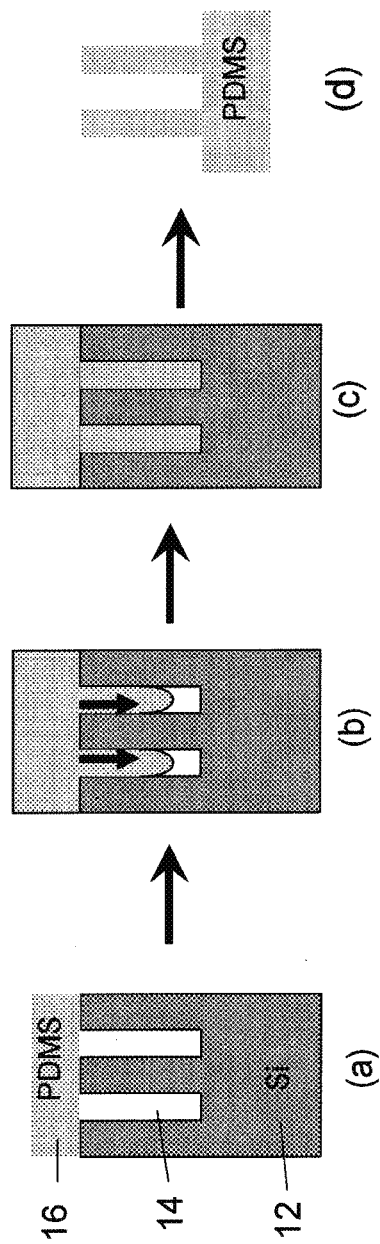
FIG. 1 is a schematic diagram showing manufacturing steps of a pillar substrate used in prior art microfluidic devices.
Figure 2:
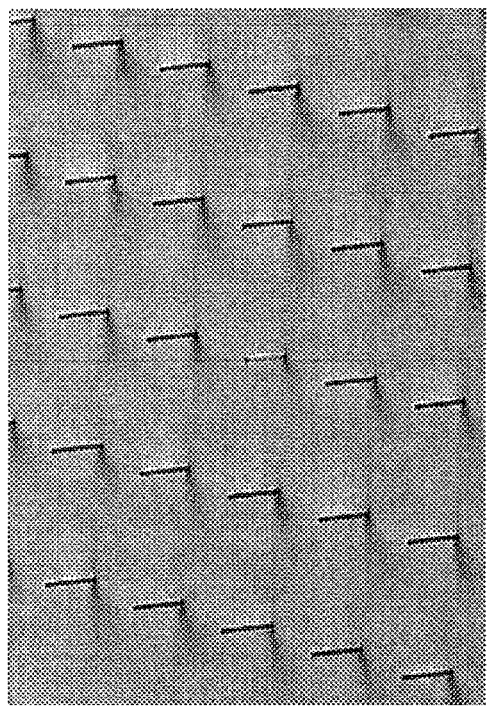
FIG. 2 is a micrograph of a reverse molded pillar array formed by conventional vacuum degassing techniques.
Figure 3:
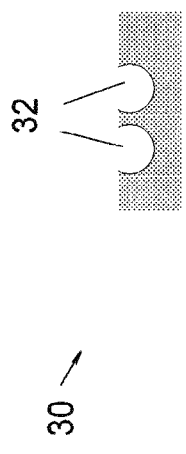
FIG. 3 is a schematic diagram of a substrate formed in accordance with the present invention.

Reference is made to FIG. 3, which shows a substrate 30 formed in accordance with one embodiment of the invention, which substrate provides a microbubble array that is useful as a microfluidic device. Substrate 30 has two spherical cavities 32 formed therein. Substrate 32 is formed by a gas expansion molding (GEM) process 40 depicted in FIG. 4. A mask or mold 42 fabricated of Si or other similar material is manufactured by etching using the DRIE or similar process to produce pits 44 therein. The pits 44 may be any shape or form, including but not limited to square, triangular, circular and rectangular in cross-section. Pits 44 may vary in diameter depending on the desired use of the end product, preferably in the range from about 20 to about 2000 microns, and more preferably in the range of about 60 to about 100 microns. By combining large (greater than 500 microns) with small (less than 200 microns), pit openings in composite devices can be formed consisting of reverse and bubble molded structures. Inconsistent GEM structures form with pit openings less than about 60 microns using conventional polymeric materials, such as polymeric materials having a low modulus between 1.5 and 2.0 MPa. An example of one such material is polydimethylsiloxane (PDMS).

During the etching process, it is possible to produce a hydrophobic coating on the surface of the mold 42 through the cyclic reaction of the etchants used, for example, SF$_6$, followed by C$_4$F$_8$ passivation steps. Alternatively, a hydrophobic agent such as a silane reagent, (e.g., perfluorododecyl-1H-triethoxysilane) or plasma deposition of a Teflon-like coating may be used to produce a water surface contact angle in the range of from about 100 to about 150°. Depending on the treatment used, the mold may be immersed in a water solution for a period of time and immediately dried under a stream of N$_2$ gas for cleaning purposes. The use of a hydrophobic coating is important for the easy removal of the polymeric substrate in the final stage of the process.

Figure 4:
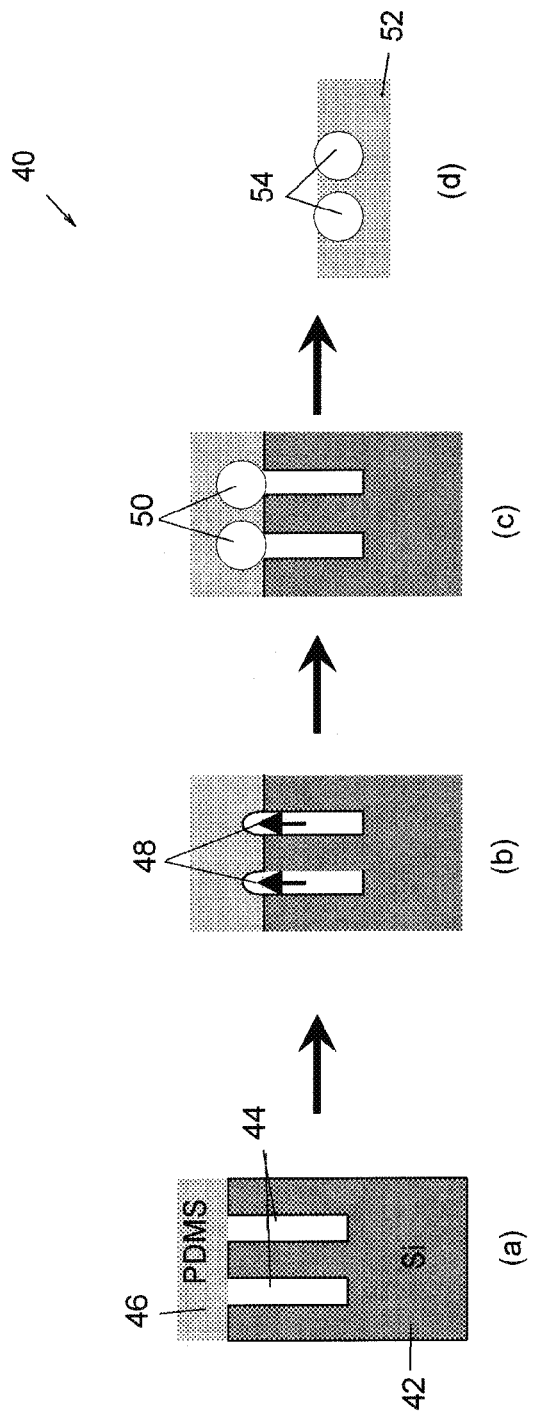
FIG. 4 is a schematic diagram showing manufacturing steps of a substrate formed in accordance with the present invention.

In step (a) of the process 40 shown in FIG. 4, a polymer 46 such as PDMS is cast over the hydrophobic mold and the sample is allowed to settle at room temperature for a period of time, for example, 30 minutes, to allow trapped gas bubbles to rise to the liquid/gas interface (Step b). Other polymeric material useful for substrates include, but are not limited to, inorganic polysiloxane (e.g., —Si—O—Si—O—) polymers, organic carbon based (e.g., —CH2-CHR—) polymers including, but not limited to, polyacrylamides, polyacrylates, and polymethacrylates.

A critical step in this process is the absence of a degassing step. No degassing is performed, as required in conventional reverse molding techniques. Polymer 46 is cured for a period of time, which time may vary depending on the polymer used. In this example, PDMS was used and curing occurred over a period of about two hours at about 100° C. This high temperature causes expansion of the gas in pits 44. A meniscus 48 is formed over each pit 44 and serves to nucleate further bubble growth as trapped gas diffuses through the PDMS 46 to form microbubbles 50 (Step (c)). The cured PDMS 46 is removed from wafer mold 42 to reveal a substrate 52 having spherical cavities 54 formed therein as shown in Step (d).

Figure 5:
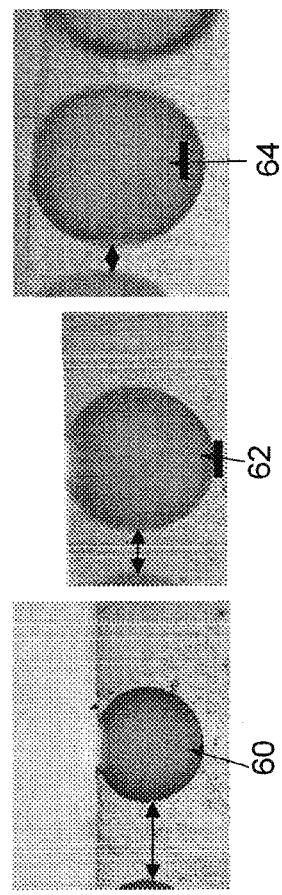
FIG. 5 is a series of micrographs of microbubbles or microcavities formed during the GEM technique.
Figure 6:
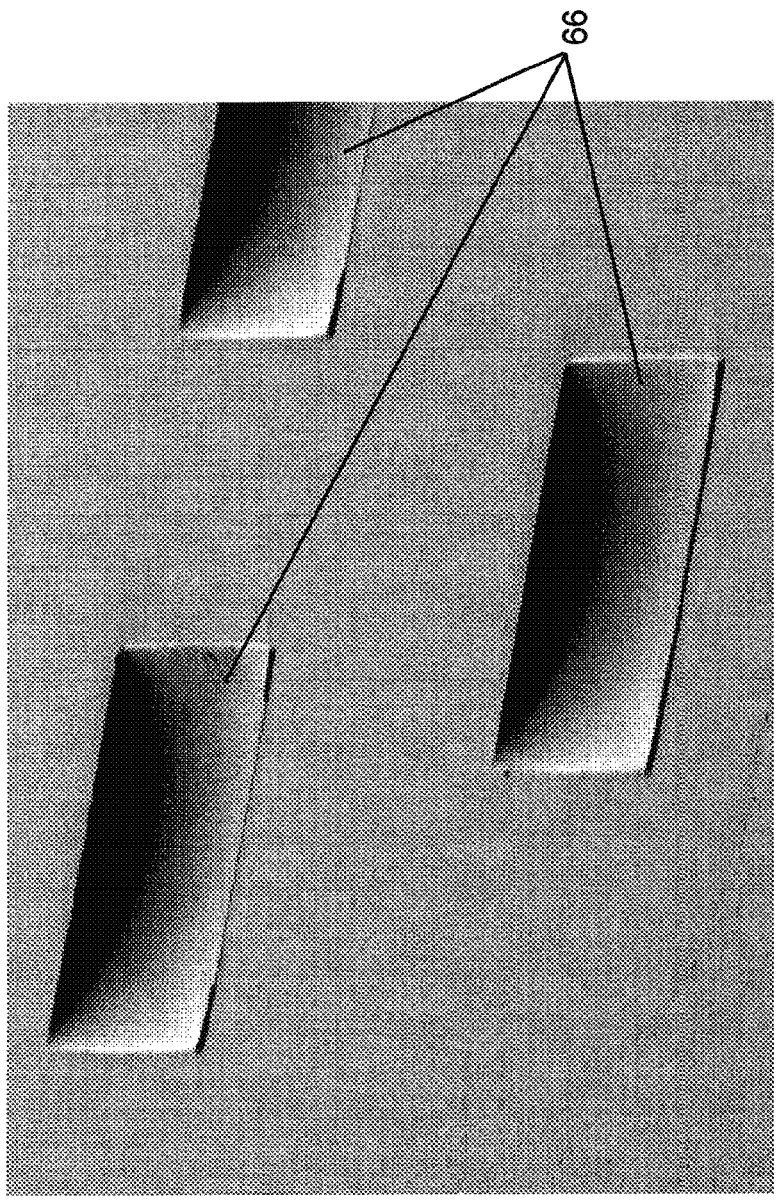
FIG. 6 is a micrograph of microbubbles formed during the GEM technique shown from an angular view.

FIG. 5 shows variations in size of spherical cavities 60, 62 and 64 created from the microbubbles formed over a square pit opening during the curing process of the polymer. The final shape and size of the final cavities may depend on a variety of factors including, but not limited to, the thickness of the polymer layer poured over the wafer mold and the dimensions of the pits in the wafer mold. The thicker the polymer layer applied onto the wafer mold, the bigger the bubble created, which is consistent with more residual gas. Keeping the depth of the pit constant, the size of the bubble increases as the area of the opening increases, i.e., the size of the bubble created is proportional to the size of the opening of the pit. FIG. 6 shows a series of curvilinear cavities 66 disposed in a substrate, viewed from an angled perspective.

Figure 7:
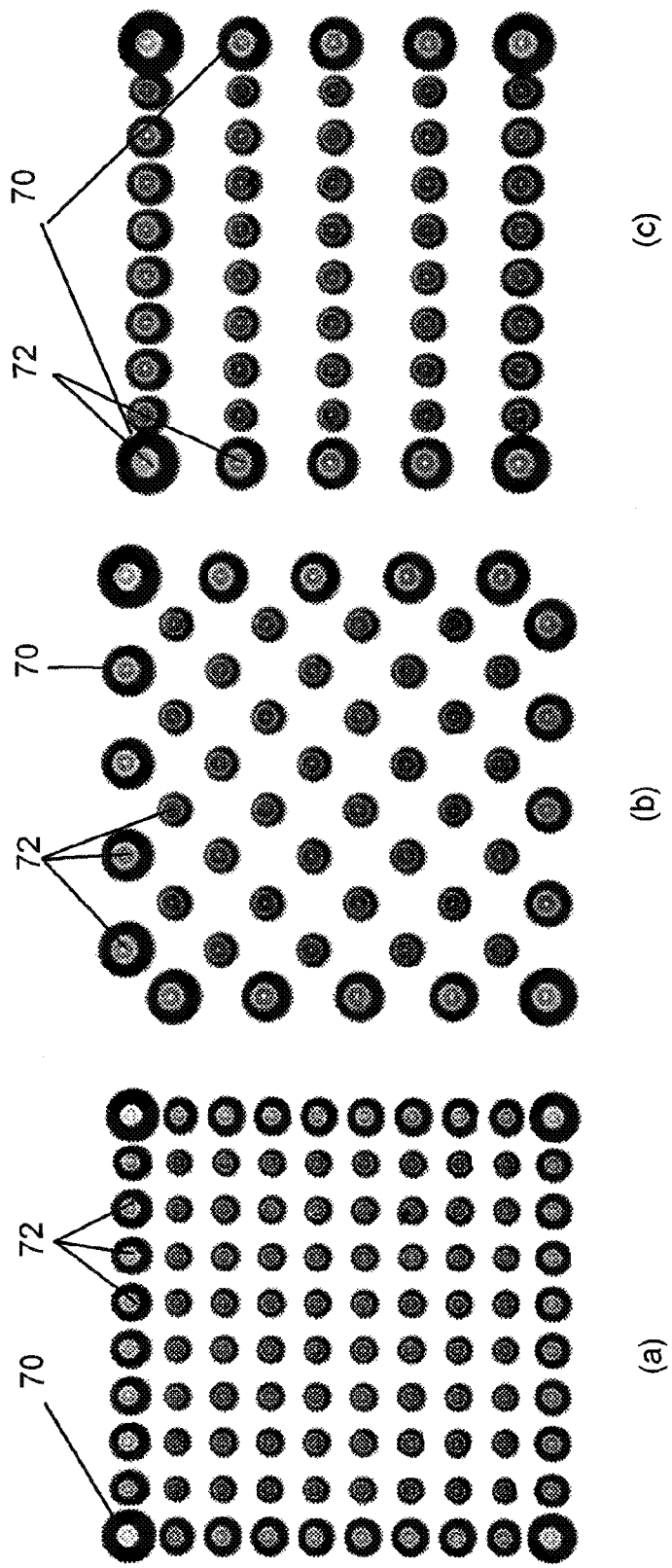
FIG. 7 is a series of micrographs of various arrays of microbubbles formed in accordance with the present invention.
Figure 8:
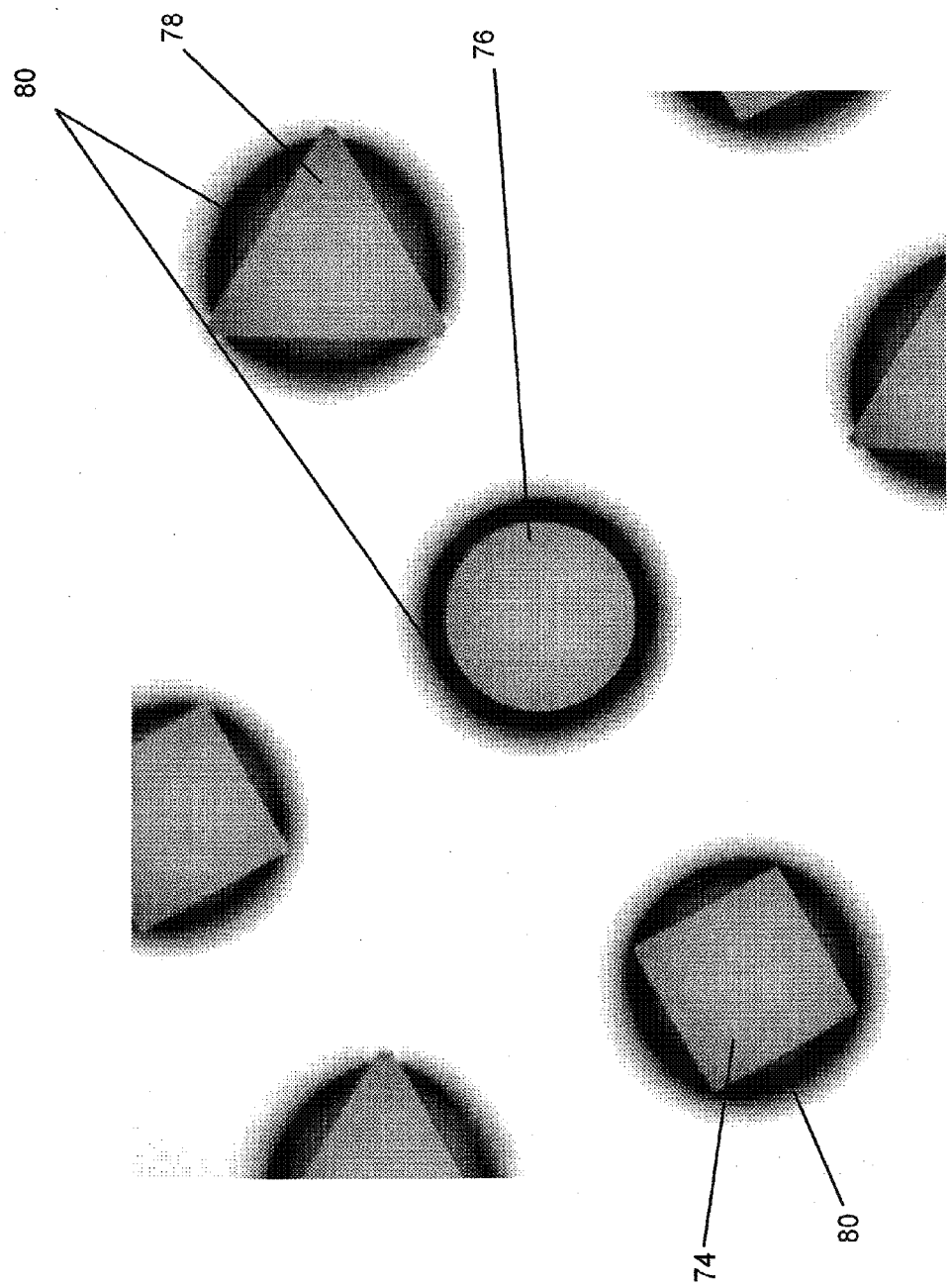
FIG. 8 is a micrograph of pits having different shapes with microbubbles formed thereon.

Spacing of the pits, also known as mask openings, is another nonobvious feature that must be considered when designing the spherical bubble array of this embodiment of the present invention. FIG. 7 depicts a variety of arrays that were produced from different arrays of circular mask openings of equivalent diameter. FIG. 7(a) depicts an array of microbubbles 70 formed over evenly spaced pits formed in a 10×10 array. Microbubble openings 72 are all the same diameter as the pit opening, but microbubbles 70 differ in size depending on their spatial location in the array. Growth of microbubbles located at array corners is less constrained in FIGS. 7(a) and 7(c), and also along the outer rows in FIG. 7(b), which shows microbubbles in a staggered array. FIG. 7(c), showing alternating row array, in addition to the larger microbubbles located in the corners, also shows larger microbubbles in the end rows running longitudinally. The end rows running laterally are slightly larger than the microbubbles located interiorly, but smaller than the corners and end rows running longitudinally. While not wishing to be bound by any theory, it is thought that this phenomenon is related to the depletion of trapped gas in the polymer premix that can diffuse to the expanding bubble. FIG. 8 shows microbubble arrays with various shaped microbubble openings 74 (square), 76 (round), and 78 (triangular). These were formed over pits with equivalent size and shape.

Figure 9:
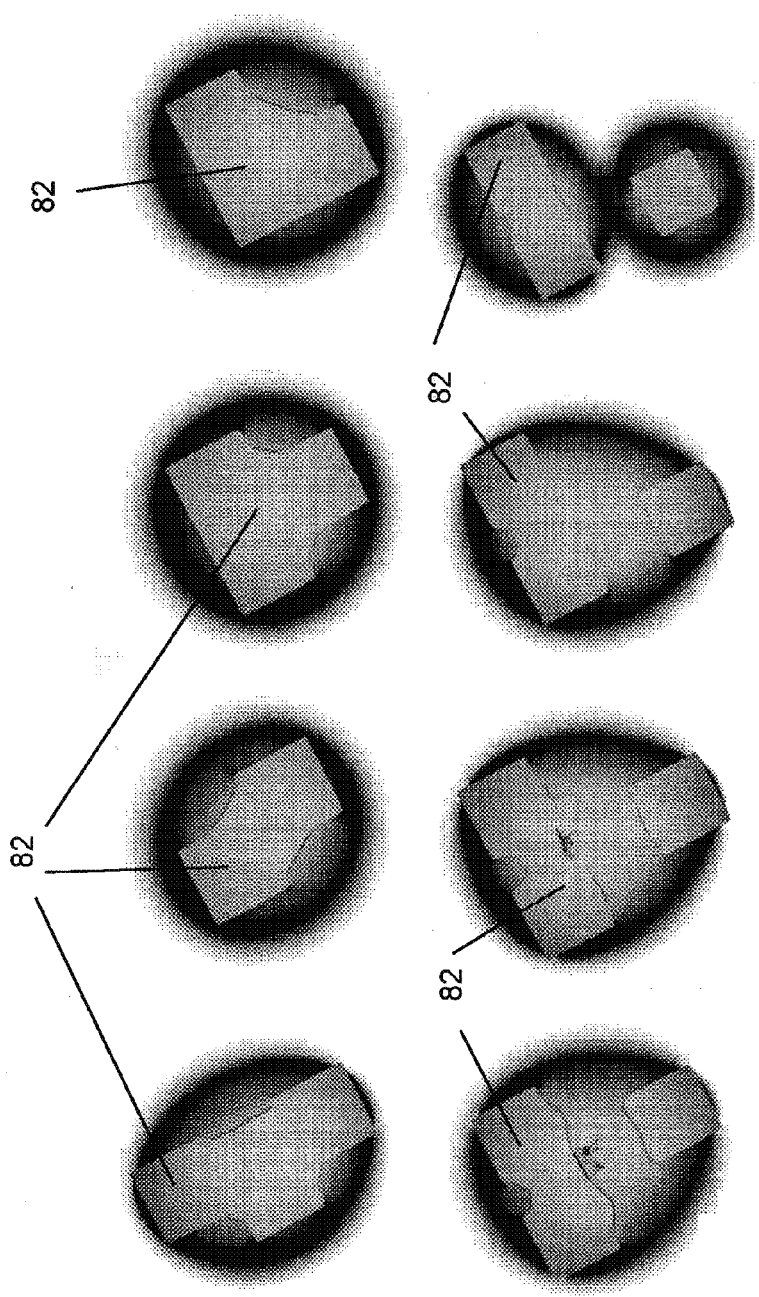
FIG. 9 is a series of optical micrographs of mutant microbubbles formed using the GEM technique, illustrating the effect of pit opening and spatial arrangement thereof.

Pit openings that are spaced close to each other, such as less than one or two diameters apart, may produce mutant bubbles 82, as shown in FIG. 9. During the polymer cure process, expanding bubbles can fuse forming obtuse shapes depending upon the spatial alignment of pit openings. It is also possible that the polymer film between adjacent microbubble openings is torn off during the mold separation process creating a much larger microbubble opening. Mutant bubbles exhibit unique flow properties. One example of the formation of mutant bubbles has been found using pit openings greater than about 40 microns in diameter with polymer thicknesses of about 0.5 to about 5 mm.

Figure 10:
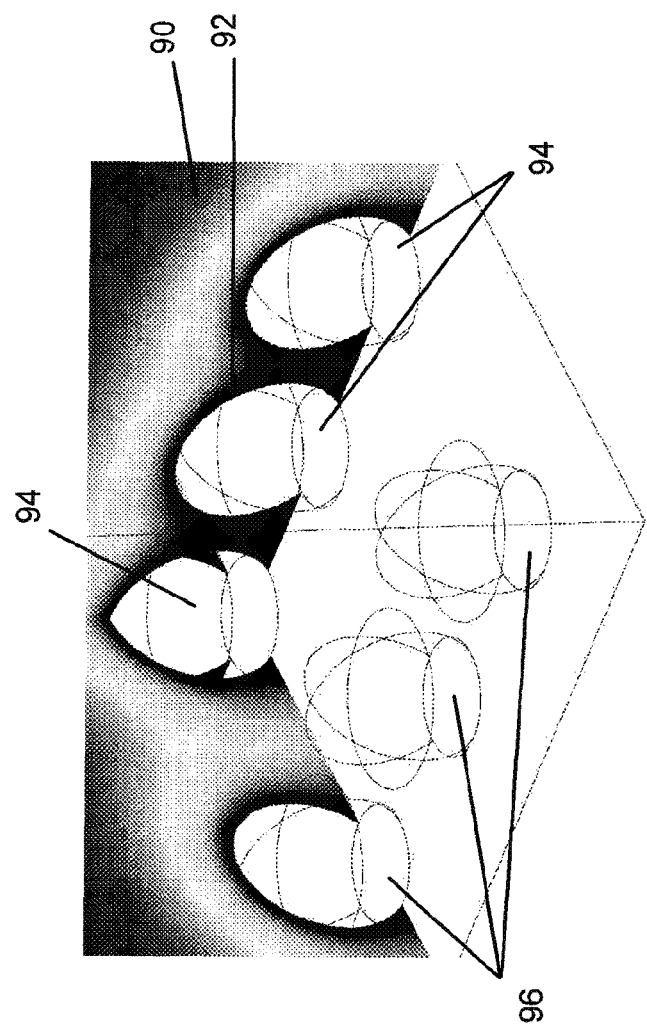
FIG. 10 is a diagram produced by finite element analysis of gas diffusion in a polymer structure containing preexisting bubbles.

FIG. 10 is directed to a micrograph created using finite element analysis. As noted above, it has been determined that close packed pits produce smaller microbubbles whereas isolated pits (e.g., inter-pit spacing greater than about 5× to 10× the pit diameter) produce larger bubbles. While not wishing to be bound by any theory, it is thought that rapid expansion of gas in the pit nucleates a meniscus and bubble growth recruits trapped gas in the polymer. Competition for gas in the polymer is a limiting factor in bubble growth during the cure process.

In FIG. 10, preliminary simulations were conducted to determine if the problem of vapor bubble growth is tractable. The initial conditions positioned pre-existing bubbles in a polymer containing dissolved gas above a pit. Bubbles were treated as sinks. Calculations were carried out with respect to the change in gas concentration as a function of time using arbitrary units. Gas concentration is indicated on a color scale with red 90 being high and blue 92 being none. Bubbles 94 on the right side of the plot are spaced more closely than the bubbles 96 on the left axis, which are spaced farther apart. After a fixed diffusion time, gas dissolved in the polymer is fully depleted between the closely spaced features 94, suggesting bubble growth would be limited, whereas gas is still available between the larger spaced bubbles 96. Factors that affect the microbubble formation include, but are not limited to, polymer thickness, gas concentration, cure temperature, cure time, and pit depth.

Figure 11:
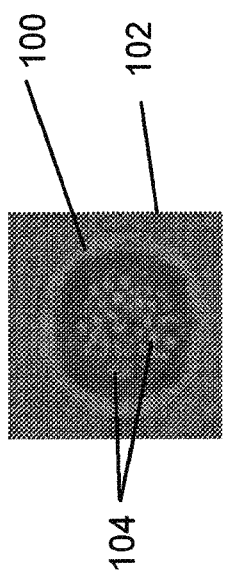
FIG. 11 is a micrograph of a microbubble showing cells cultured in 6 days.

In a method of using the microbubble arrays, fluid flow properties are examined. An example of a use of the arrays is for the deposition of cancer cells using flow or gravity to sustain these cells in a microculture. FIG. 11 shows a spherical cavity 100 made in accordance with this embodiment of the invention disposed in a substrate 102 having cultured cells 104 therein.

Figure 12:
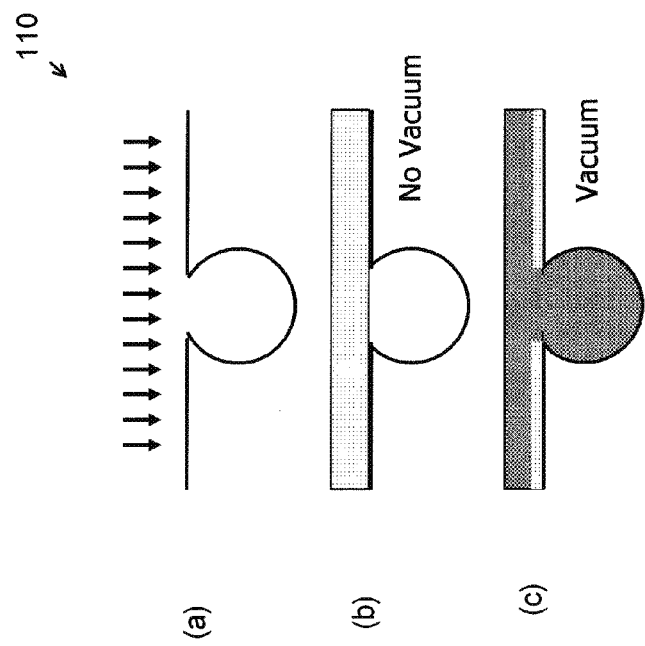
FIG. 12 is schematic diagram of a microbubble being coated using vacuum-assisted technology.

A key requirement for utilizing microbubble arrays in cell sorting and microcell culture, examples of two forms of use of the microbubble array herein, is the ability to selectively and spatially alter the polymer surface chemistry. FIG. 12 is a schematic diagram of a vacuum-assisted coating (VAC) procedure 110 used to selectively coat bioactive molecules onto a microbubble wall 112 and the microchannel surface 114. The capability is desirable as it may be advantageous to coat the microchannel surface 114 with a blocking agent, such as bovine serum albumin (BSA) or polyethylene glycol (PEG) to prevent nonspecific cell interactions while depositing a chemotactic (e.g., stromal-derived factor-1 (SDF-1), IL-8) or extracellular matrix molecule, such as a protein (e.g., collagen, fibronectin), or an adhesive ligand or receptor (e.g., selectin, antigen, antibody) in the microbubble wells 112 to enhance cell capture, adhesion or bioactive molecule to direct cell fate. The VAC process takes advantage of and is used to overcome the intrinsic PDMS polymer hydrophobicity ($\theta \sim 105°$).

As an example, the VAC process may begin with Step (a), where the polymer sample is exposed to UV-ozone (BioForce Nanosciences ProCleaner) for 1 hour. Although used in this non-limiting example, the VAC process may be conducted without the use of this ozone step. Alternative methods may also be used to render the surface hydrophilic including, but not limited to, the application of oxygen gas plasma. This treatment makes the ozone-contacted surfaces hydrophilic ($\theta < 105°$). A shadowing effect occurs that renders the undersurface at the microbubble entrance 112 sufficiently hydrophobic to inhibit aqueous solutions, gently dispensed on the planar surface 114, from entering the microbubble 112, as shown in Step (b). The application of a vacuum in Step (c) indicates that it is possible to coat bioactive molecules on the microchannel surface 114 that may or may not differ from those deposited in the well 112.

Microfluidic flows using microparticle image velocimetery of isolated microbubbles (nearest microbubble is greater than about 10× bubble diameter opening) with square (80 microns) opening reveal asymmetric fluid flows above the entrance that extend into the cavity. Asymmetric flows depend on microbubble size and fluid shear stress. Under a constant shear stress of 5 dyn/cm$^2$ (about 0.2 ml/min) microparticles enter the cavity at the down stream edge. Stable asymmetric recirculating vortices develop causing the microparticles to exhibit a triangular velocity trace in the cavity with fore-aft asymmetry. Along the microbubble well bottom they flow counter to the main stream. At the top of the cavity, they flow parallel to the main stream. This flow/shear stress profile can be altered by changing the flow velocity and/or microbubble geometry. This enables one to customize the mixing and nutrient/waste exchange in LOC applications.

Figure 13:
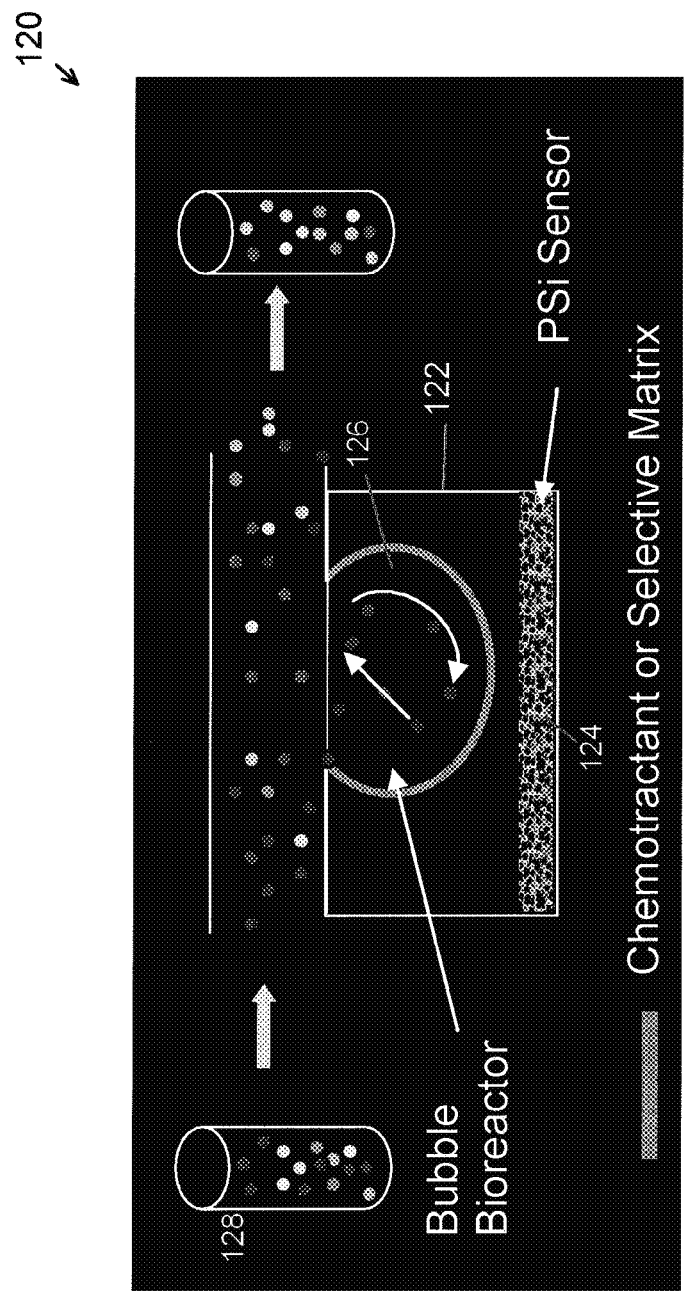
FIG. 13 is a schematic diagram of a microfluidic device with an integrated microbubble device and an optical Porous Silicon (PSi) sensor.

FIG. 13 is just one example of a device 120 that incorporates the microbubble array of the embodiments of the present invention. A substrate 122 includes an optical biosensor 124 such as Porous Silicon (PSi) embedded therein. A spherical cavity 126 is disposed in substrate 122. A chemotractant, biomolecular ligand, and flow properties causes target cells to form the cell mixture 128 into the spherical cavity 126. The PSi optical sensor 124 is designed to detect certain types of cells or cell products, collected in spherical cavity 126, or to monitor specific chemical signals (cytokines, gases, small molecules) or cell concentrations within spherical cavity 126 in real time.

As described herein, a microfluidic device is provided using GEM molding and VAC techniques. The microbubble features are applicable to diagnostic, therapeutic, and investigative purposes in the many research areas including rare cell sorting, stem and cancer cell research. Examples of devices that can incorporate the microbubble feature include, but are not limited to, devices for drug screening, pharmacokinetic analysis, cytotoxicity analysis, cell capture, quorum sensing, isolation of cells, and chemotherapeutic response of cells.

EXAMPLES

Example 1

Effect of Wafer Coating on Microbubble Formation

The PDMS pre-polymer is applied to the silicon wafer mold as described in the Materials and Methods. Prior to curing, the viscous pre-polymer does not readily infiltrate the pits of the wafer mold due to the surface tension between the pre-polymer and the hydrophobic mold coating. This allows for meniscus nucleation and microbubble growth above the mold opening during curing. Three types of hydrophobic coatings, the Bosch process passivation coating, PTFE plasma deposited coating, and the applied FDTS coating were examined to determine the microbubble formation efficiency (MBFE=the # of microbubbles that form/total # of mold openings). These coatings had measured water contact angles (θw) of ~105°, ~120°, and ~105°, respectively. Each of the three hydrophobic coatings were tested by molding PDMS onto a patterned silicon wafer containing 10×10 arrays with circular and square mold openings 100 µm in diameter and depth of 100 µm. The Bosch process passivation layer had a MBFE of >99% for both 100 µm square and circle openings in 10×10 arrays indicating the most consistent formation of microbubbles. It was also observed that the Bosch coating performed best with pit openings of other sizes ranging between 60-200 microns. Interestingly, for square openings the plasma deposited PTFE coating performed the worst. Reasons for this are uncertain but likely are due to inefficient PTFE deposition (0.2 µm) over mold features with sharp corners. MBFE may be improved with increasing the thickness of the PTFE coating. The higher MBFE achieved with the FDTS coating applied by liquid immersion is likely due to the fact that the solution infiltrates the mold features to deposit a more uniform coating in and around the square pit.

Example 2

Effect of Wafer Mold Opening Size and Shape

Figure 14:
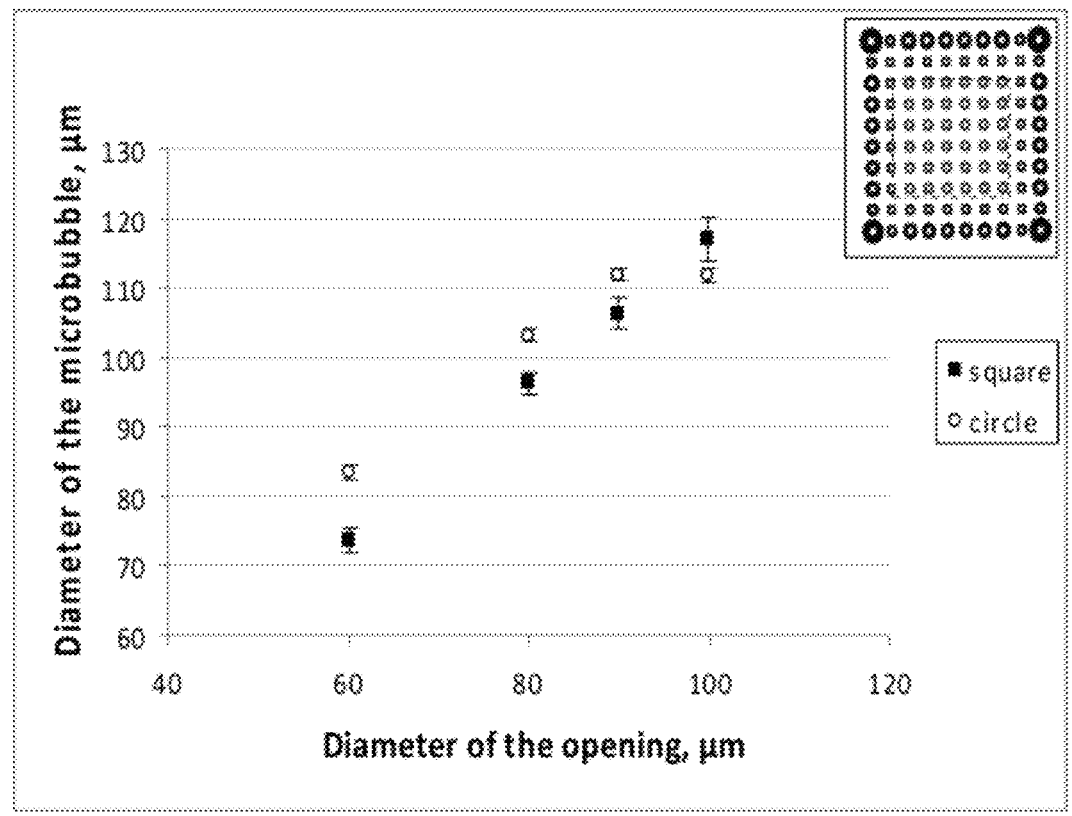
FIG. 14 is a graph of the diameter of microbubbles formed in PDMS versus the diameter of the opening.

The silicon wafer mold opening size and shape both influence the dimensions of the microbubbles that form above them. To quantify these, analysis includes only the 6×6 matrix of the inner microbubbles of a 10×10 array, due to spatial edge effects discussed below (FIG. 14, inset). Results show that increasing the diameter of the mold opening leads to a linear increase in microbubble diameter for a PDMS chip thickness of ~1 mm, as shown in FIG. 14 (where the pit depth is 100 µm, and showing the diameters of the inner microbubbles of a 10×10 array (inset) for circle (○) and square (■) opening diameters of 60, 80, 90 and 100 µm (n=72)). Two representative sets of 6×6 inner arrays, molded in the same PDMS cast, were analyzed (n=72 microbubbles) for each sized opening. The correlation coefficient $R^2$ for the square and circle openings is 0.99 and 0.92, respectively. Similar uniformity trends are observed in subsequent PDMS casts from the same silicon mold. The positive correlation between microbubble size and mold opening is related to the microbubble formation mechanism. The mold opening nucleates the formation of a meniscus in the PDMS pre-polymer due to expansion of gas in the pit during the rapid heat cure process. Residual gas in the PDMS pre-polymer diffuses to the meniscus and fuses to form the microbubble compartment. Microbubble growth ceases when residual gas is depleted (as shown below) and/or when the PDMS cures. Increasing the size of the mold opening increases the surface area of the nucleation site allowing for larger microbubbles to form.

The shape of the pit opening also contributes to the dimension of the microbubble. Circular openings form microbubbles that are statistically larger ($p<0.0001$) than those formed over square openings for pit opening dimensions ranging between 60-90 µm diameter (see FIG. 14). Reasons for this possibly relate to the presence of stress at the pit opening. For the circular geometry, forces distribute evenly along the periphery of the mold opening, allowing for more even microbubble growth. Conversely, cohesive forces exerted at the sharp corners of the square opening may hinder microbubble expansion. This phenomenon likely contributes to the lower MBFE observed for square openings. A similar finding was reported in a recent study of microbubbles generated by electrolysis, which found micro-fabricated circular electrodes formed bubbles more reproducibly and with more uniform size compared to square or triangular electrodes. However, it was also observed that when the mold opening is 100 µm in diameter the square openings produce statistically larger diameter microbubbles, 117±3.2 µm, compared to those formed over circular openings, 112±1.8 µm ($p<0.0001$). This transition is likely due to subtle differences in microbubble shape which lead to constriction in bubble growth. Cross-sectional analysis reveals that microbubbles formed over circular pits adopt a slight obtuse shape in contrast to the near perfect spherical cross-section formed over square mold openings. It is possible that microbubble expansion over large closely spaced circular mold features becomes laterally constricted. The nonobvious phenomenon of spatial constraint is discussed further below.

Example 3

Effects of Spatial Arrangement of Wafer Mold Openings

Figure 15:
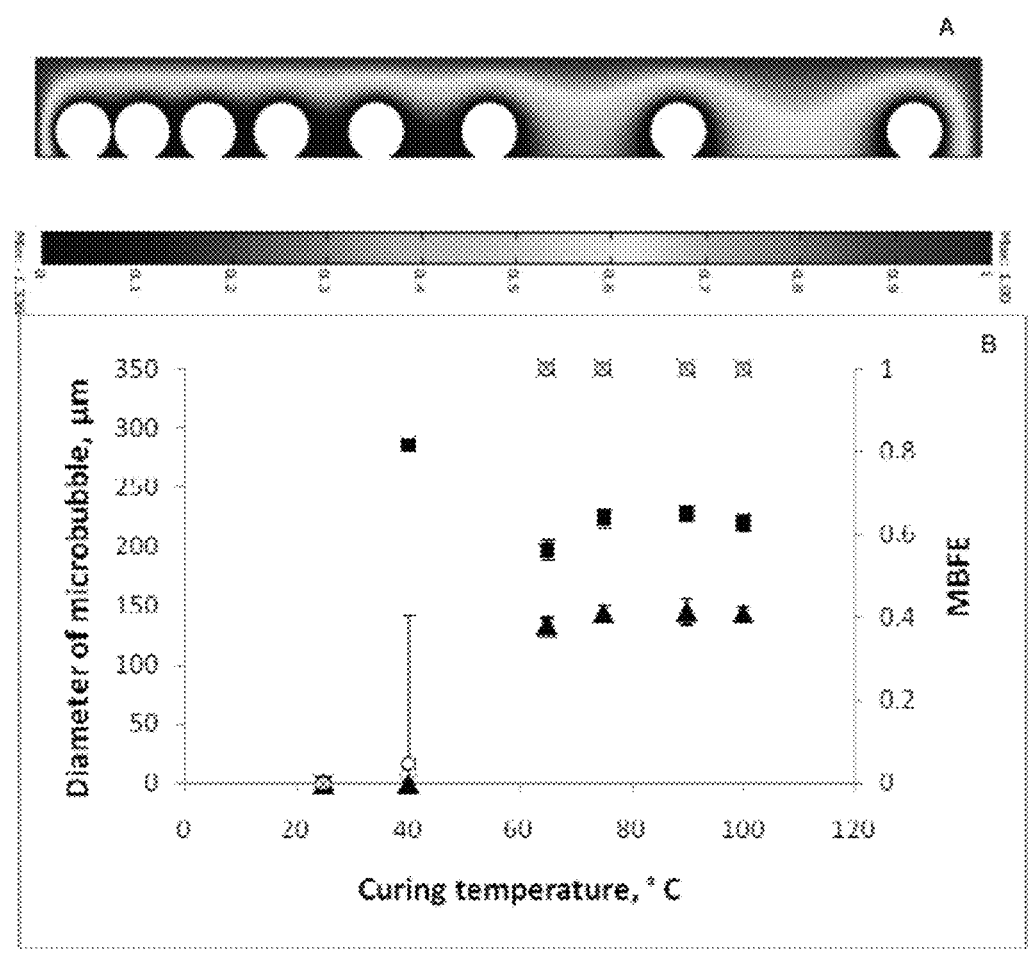
FIG. 15 is a graph of: (A) a COMSOL simulation depicting the effect of residual gases available to constricted versus unconstricted microbubbles; and (B) the effect of PDMS curing temperature on the diameter of unconstricted (■) vs. constricted (▲) microbubbles and the corresponding microbubble formation efficiency, ○ and x, respectively (n=20)

Parametric studies on microbubble formation in PDMS have shown that there are nearest neighbor spatial effects on the size of the microbubbles that form in an array format (see FIG. 14, inset). Microbubbles formed at the corners of the 10×10 array are larger than the edge row microbubbles, which are larger than interior microbubbles. The relative size of microbubbles in an array depend on the specific spatial arrangement of pit openings. For example, microbubbles at the corners of a 10×10 array range between 1.5 to 2.6 times larger in diameter than (constricted) microbubbles in the array interior. This phenomenon can be attributed to a competition for available gas trapped in the PDMS prior to the cure point which depends on PDMS thickness. Microbubbles that are unconstricted have more gas available to them and face less competition from adjacent nucleation sites. Thus, corner microbubbles grow larger than edge row, which are larger than interior microbubbles which are the most constricted. Comsol simulation studies of gas diffusion from the bulk to microbubbles supports this idea (see FIG. 15A, where color coding indicates high (red) to low (blue) gas concentration at steady state). Microbubbles sinks were spaced an increasing distance apart and when steady state diffusion conditions were attained, results show that the gas concentration is significantly depleted between constricted (closely spaced) microbubbles. A higher gas concentration is evident between microbubbles spaced far apart (unconstricted). This phenomenon also explains why increasing the PDMS thickness produces larger microbubbles. Thicker PDMS films provide larger dissolved gas reservoirs.

Example 4

Effect of Mold Feature Depth and Uniformity of Microbubble Formation

The effect of mold feature depth, ranging from 25 µm to 100 µm microbubble formation was also investigated. The deeper the feature depth the more air that is trapped when the PDMS is poured onto the wafer mold. Results reveal, however, that similarly sized microbubbles form independently of depth. For all feature depths, the volume of the microbubble formed far exceeds the volume of air in the feature theoretically expanded at 100° C. This provides further support for the importance of dissolved air in the PDMS pre-polymer contributing to microbubble formation. Mold feature depth is observed, however, to be an important factor in contributing to the reproduciblity of microbubble formation sample-to-sample (i.e. repeated PDMS molding from the same DRIE wafer). Pit depths >50 µm are required for repeated use of wafer molds to form microbubbles with high MBFE cast-to-cast. This is attributed to the thickness of the hydrophobic coating that forms with longer DRIE etch times. For example, with 100 μm deep features it is possible to mold unconstricted microbubbles over 60, 100 and 200 μm diameter openings with consistent size across a 4-inch wafer. Detailed analysis showed efficient microbubble formation MBFE >98% with microbubble diameters that varied <10% across the 4-inch chip. Tighter control of PDMS thickness would increase the uniformity of microbubble diameter across large areas. Locally within a 10×10 array (see FIG. 14) the microbubble diameter coefficient of variance was <1%. These data demonstrate that uniform, homogenously sized microbubble arrays can be fabricated over a large area (~6 in$^2$). Moreover, provided that the hydrophobic coating is not damaged mechanically or by cleaning with inappropriate solvents, a wafer mold can be repeatedly used with no known limit. This makes microbubbles a cost advantaged technology.

Example 5

Effects of Cure Time at 100° C. on Microbubble Formation

Figure 23:
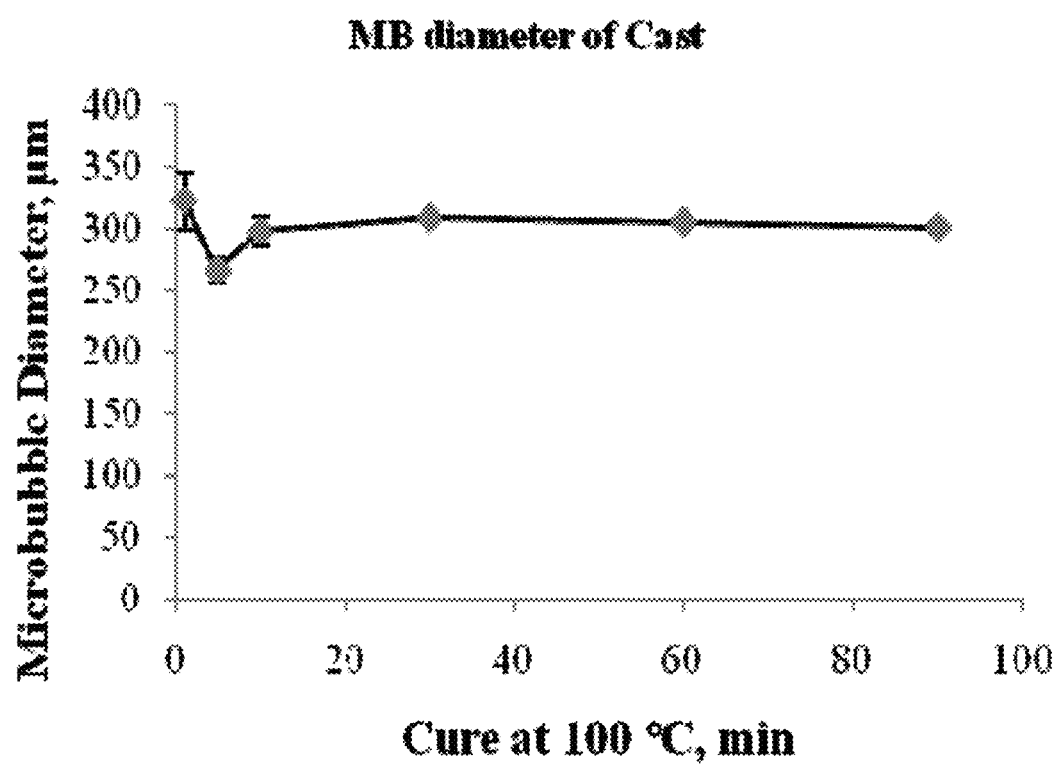
FIG. 23 is a graph of the diameter of microbubbles over time during curing at 100° C.
Figure 24:
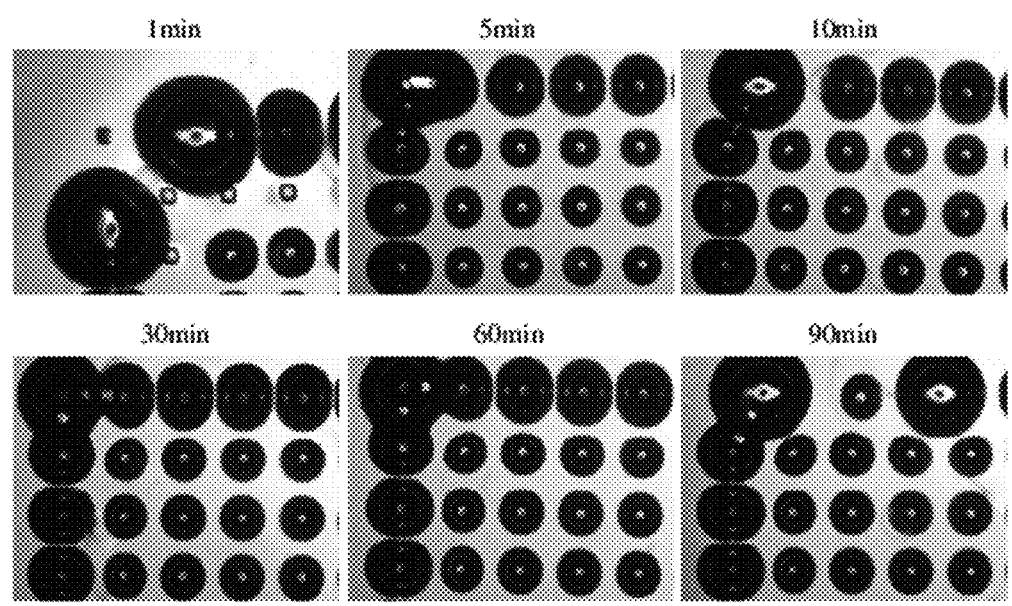
FIG. 24 is a collection of images of microbubbles formed over time.

Studies suggest that there is a dependence of microbubble formation on PDMS curing time at 100° C. cure temperature. PDMS can be cured at room temperature, but this does not result in microbubble formation. Curing at a temperature >65° C. is required to form microbubbles. High temperature is needed to expand gas trapped in the pit and to facilitate diffusion of gas dissolved in the polymer premix to feed microbubble growth at nucleation sites above each pit. Studies were conducted to investigate the kinetics of microbubble formation. Although the standard procedure is to cure PDMS for 2 hr at 100° C., results shown in FIGS. 23 and 24 indicate that microbubbles form within the first 5 minutes of curing at 100° C. In these studies a sample, comprised of polymer premix cast onto a silicon mold with etched pits in 10×10 array, is placed in the 100° C. oven for a fixed time ranging from 1 to 90 minutes. After the fixed time the sample is removed from the oven and allowed to finish curing at room temperature. Microbubble size measurements were made after 24 hr on the inner 6×6 array only (n=72). Microbubble formation is evident following just 1 minute in the 200° C. oven however, microbubble formation efficiency is low and microbubble size in not uniform across the array. Curing the sample for ≥10 min at 200° C. is sufficient to form microbubble with uniform size across the array.

Example 6

Effects of PDMS Thickness on Microbubble Size

Figure 25A:
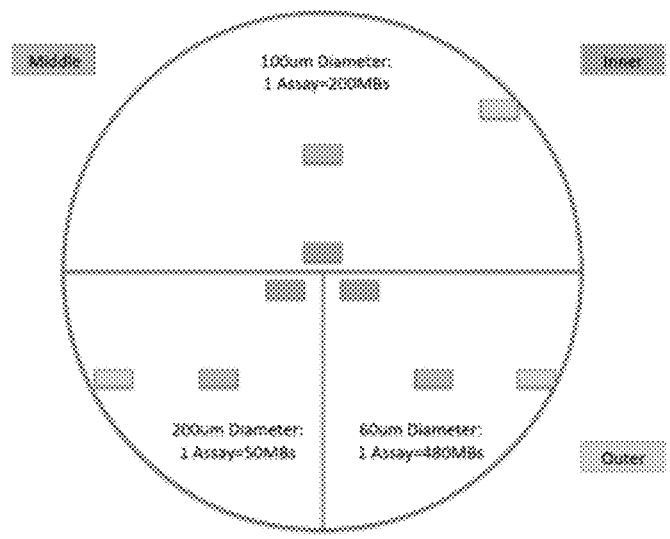
FIG. 25A is a plot of the average microbubble diameter formed at different locations with circular 100 um diameter openings as a function of PDMS thickness, including a schematic of a 4-inch microbubble array defining inner, middle and outer regions that were analyzed.
Figure 25B:
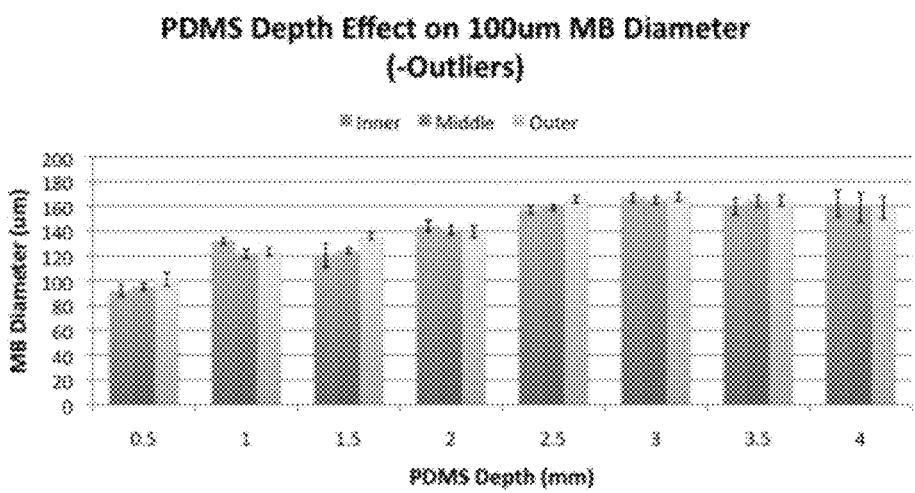
FIG. 25B is a graph showing that co-variance as a function of PDMS thickness (0.5 to 4 mm) was <5% (>200 microbubbles counted per data point).

It was possible that there is a dependence of microbubble size on the thickness of the polymer layer. In general, the volume of the microbubbles that form far exceeds the volume of gas trapped in the mold pit expanded at 100° C. cure temperature. This observation supports the key role that dissolved gas in the polymer has in diffusing to nucleated bubbles supporting microbubble growth. The thicker the polymer the larger the dissolved gas reservoir. An example set of data illustrating this effect and the ability to mold homogenously size microbubbles over large arrays is given in FIGS. 25A and 25B. FIG. 25A illustrates regions (inner, middle, and outer) on a 4 inch diameter silicon mold that chips were fabricated with constrained microbubble (pit spacing 3× opening diameter) and used for size measurements. FIG. 25B summarizes measurements of microbubble maximum diameter as a function of PDMS thickness ranging from 0.5 mm to 4 mm. All microbubbles had approximately 100 μm diameter circular openings in these particular experiments. Microbubble diameters range from ~100 μm with PDMS thickness of 0.5 mm (aspect ratio ~1) to ~160 μm with PDMS thickness >2.5 mm (aspect ratio ~1.6). Microbubble size asymptotes above 2.5 mm suggesting the maximum size is constrained by nearest neighbor effects.

Example 7

Effects of Curing Temperature of PDMS Pre-polymer

Studies suggest that there is a dependence of PDMS curing temperature on formation and the size of microbubble. FIG. 15B shows the diameter of the constricted (▲) and unconstricted (■) microbubble and their MBFE (○ and x, respectively) as a function of curing temperature (n=20 and error bars are standard error). For curing temperatures ≤40° C. microbubbles form inconsistently with different sizes causing large standard error. At curing temperatures ≥65° C. microbubbles form with near 100% efficiency and their sizes are nearly temperature independent. This data suggests that temperatures ≥65° C. are needed to attain the gas expansion and diffusion requirements for microbubble formation. At lower temperatures, there is insufficient free energy available to mechanically and thermodynamically overcome the interfacial tension between the viscous PDMS pre-polymer and the air trapped in the mold feature and/or gas diffusion through viscous premix is slow which favors reverse molding or inconsistent microbubble formation.

Example 8

Effect of Residual Gases in the PDMS Pre-polymer

Microbubbles are unable to form in PDMS which has been degassed. This result further supports the theory that the formation of the microbubble is, in large part, due to the recruitment of gases in the pre-polymer to the nucleation site at the openings in the silicon wafer mold. In order to investigate the effects of the composition of residual gas in the pre-polymer on microbubble size, a series of degas/regas experiments were conducted. First, the PDMS pre-polymer was degassed in vacuum (-690 mmHg relative to atmospheric pressure) for one hour and subsequently aerated with different gases ($N_2$, Ar, $CO_2$, He, and compressed air) before curing. Microbubble size was then determined and tabulated. Results show that the size of the microbubble and the MBFE compared to non-degassed controls depends on the composition of the gas aerated into the PDMS pre-polymer.

Figure 16A:
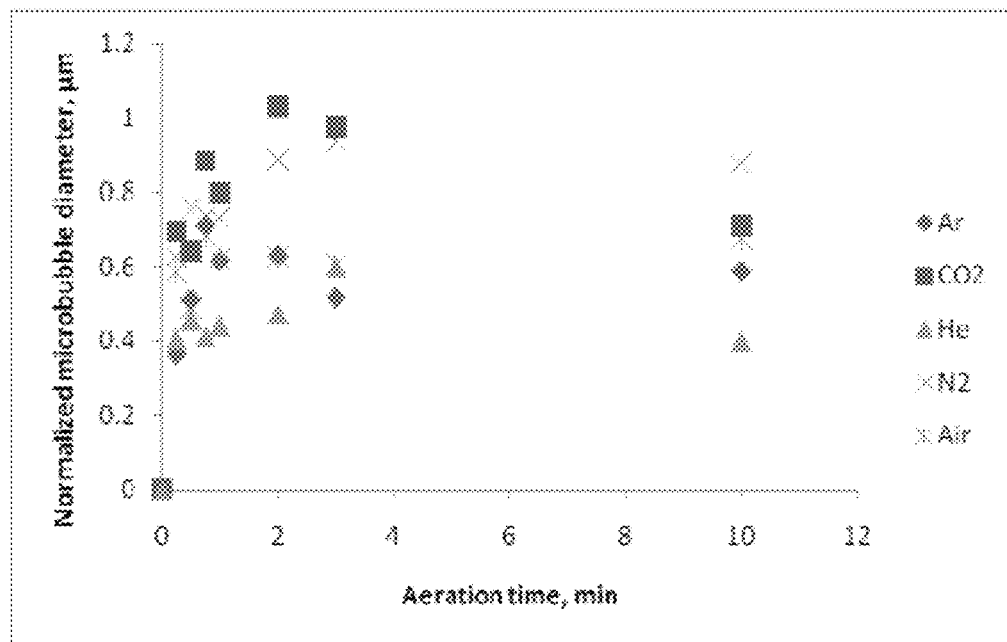
FIG. 16A is a graph showing normalized microbubble diameter measured after regassing the degassed PDMS pre-polymer with nitrogen, argon, carbon dioxide, helium, and compressed air at various aeration times.

FIG. 16A shows the average normalized microbubble diameter formed from aerated samples as a function of regas time compared to controls. The general trend observed is that $CO_2$ forms the largest microbubbles, achieving between 60-100% recovery of the control microbubble diameter. Nitrogen also formed large microbubbles ranging between 60-90% of control. The other three gases (Ar, He, and compressed air) formed microbubbles between 40-75% of the control diameter. These trends are consistent with expectations based gas solubility (S), and the rate of diffusion (D) of these gases in PDMS. Gas permeability (P) is given by the product of S*D. As shown by others, $CO_2$ has the highest solublity through PDMS ($400\times10^2$ $cm^3$(STP)/$cm^3$ atm) and He has the lowest ($0.03\times10^2$ $cm^3$(STP)/$cm^3$ atm). This suggests that after aeration with $CO_2$, a higher concentration is sustained in the viscous PDMS pre-polymer compared to the other gases. Similarly, $N_2$ has a high solubility ($110 \times 10^2$ $cm^3(STP)/cm^3$ atm, and is expected to form large microbubbles, but smaller than $CO_2$ as is observed. In contrast He, due its inertness and small size, has a low solubility and higher D ($5.6 \times 10^8$ $cm^2/s$) compared to $N_2$ ($1.3 \times 10^8$ $cm^2/s$). Hence, aeration with He forms microbubbles on average only half the size of control. These results confirm that a balance is necessary among the physical properties of the gases in the PDMS that influences the resulting microbubble size.

Figure 16B:
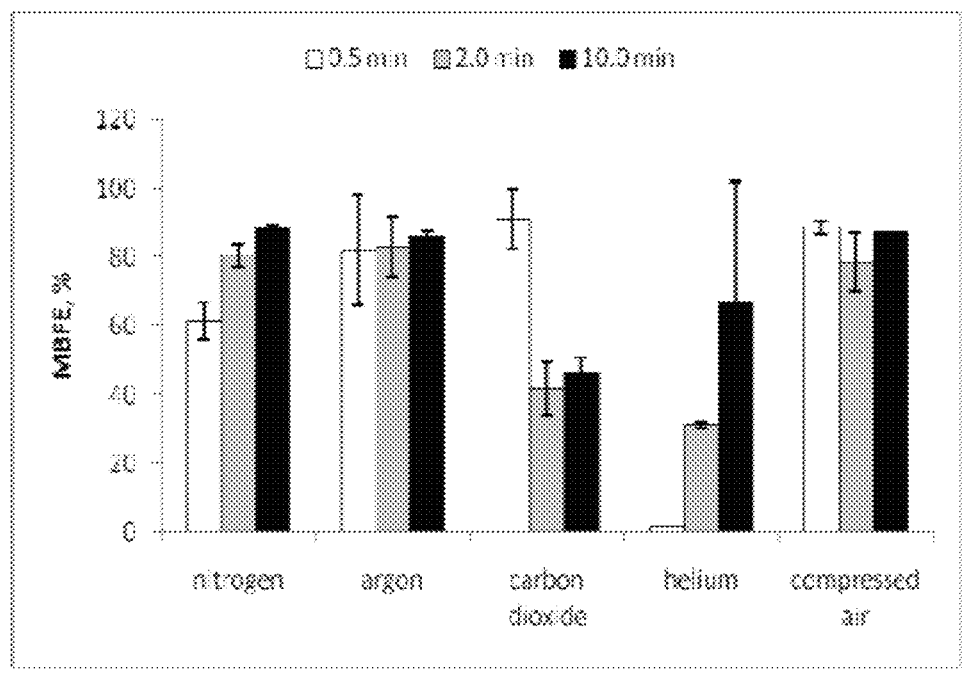
FIG. 16B is a graph of the microbubble formation efficiency (MBFE) for nitrogen, argon, carbon dioxide, helium, and compressed air at 0.5, 2, and 10 min of aeration time.

The corresponding MBFE is also dependent on the type of gas that is aerated into the degassed PDMS pre-polymer (see FIGS. 16A and 16B). Aeration with nitrogen, argon, and compressed air samples formed microbubbles most efficiently (MBFE>80%), as shown in FIG. 16B. While carbon dioxide recovers microbubble size to the greatest degree, it forms them inconsistently (MBFE~50%). Nitrogen is the only gas to have >80% recovery of microbubble size compared to native air and MBFE~80%. Since nitrogen is the major component of ambient air, this suggests that its presence may facilitate consistent microbubble formation. Further studies would be necessary to optimize the aeration procedure to be able to control microbubble size and formation efficiency by this technique. Nonetheless, these results prove that dissolved gas in the pre-polymer is required for microbubble formation.

Example 9

Advantages of Microbubbles for Cell Culture

Goal is to advance microbubble technology for cancer and cell biology research and to demonstrate the unique advantages of this architecture over existing technologies; namely standard tissue culture polystyrene (TCP) and microfabricated rectilinear wells. A typical microbubble with a 100 µm opening and a 250 µm diameter has a volume of 8.18 nL. This is more than 4× larger than the volume of a cylindrical rectilinear well with the same sized opening and depth (1.96 nL). The increased microbubble volume minimizes the susceptibility to vertical diffusion limitations which is commonly observed in rectilinear wells with aspect ratio (>1). Plating 10 cells per microbubble (250 µm diameter) has a near equivalent cell plating density of ~5000 cells/$cm^2$ in a standard 96-well TCP (0.32 $cm^2$) seeded with ~1600 cells per well. However, the microbubble inherently provides a ~75× lower volume of media per cell compared to a 96 well plate (100 µL) assuming minimal fluid exchange with a media reservoir external to the microbubble. This allows for the concentration of secreted factors produced by cells to rise to high levels quickly, creating a local microenvironmental niche that can influence cell function. In the following, three applications of microbubble technology are presented that exemplify this and other advantages for cell culture. Examples include 1) single cell culture in microbubbles, 2) formation of arrays of homogenously sized 3D cell aggregates, and 3) demonstration through experimentation and simulation that the bubbular architecture provides a microenvironmental niche that can influence cell response. These studies confirm that cells cultured in microbubbles can condition their microenvironment, enabling their survival and proliferation to adopt a characteristic cell colony phenotype. These examples demonstrate that microbubbles constitute a novel in vitro tool that can transform basic studies in cell biology, cancer and stem cell research.

Example 10

Microbubbles Support Single Cell Culture

Figure 17A:
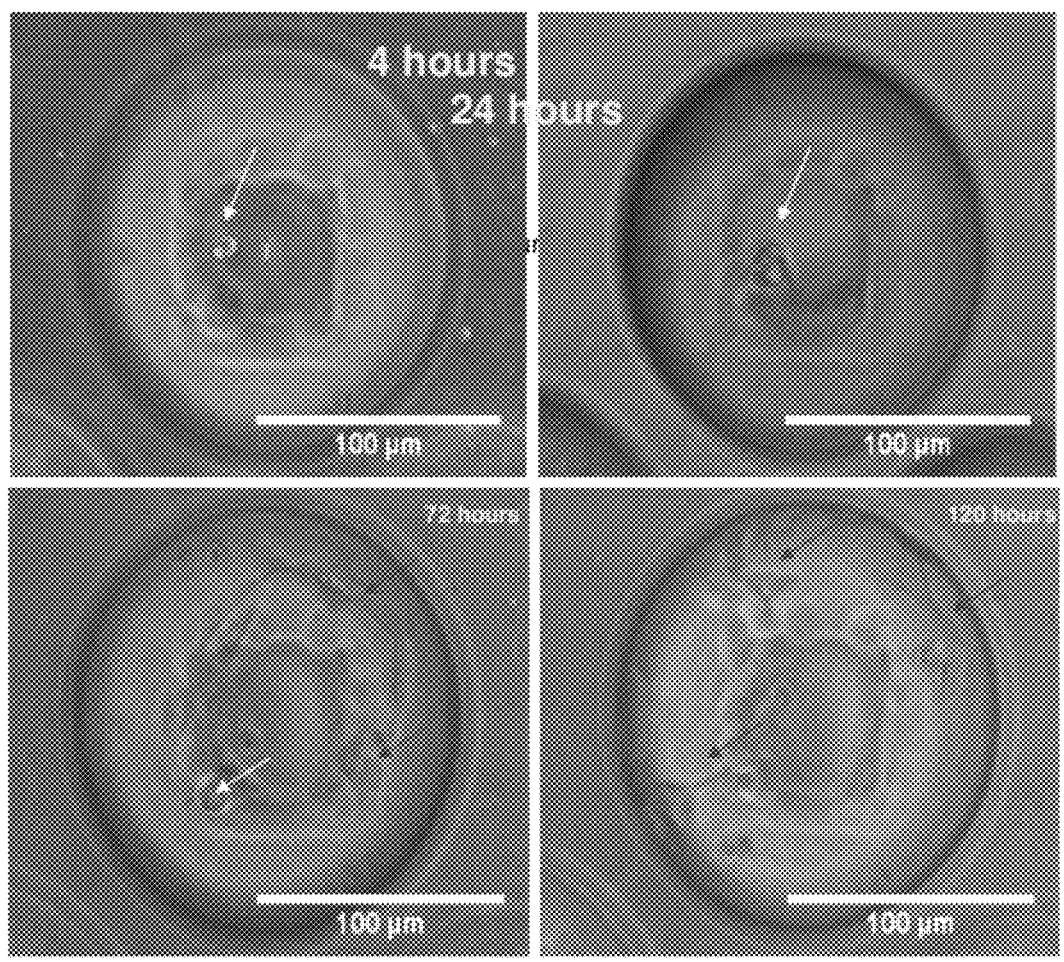
FIG. 17A is a picture of a single HaCaT cell seeded in a plasma-treated hydrophilic microbubble, where cell spreading and proliferation are evident at 24 hours and epithelial sheets are evident at 72 hours (white arrows point to cells and red arrows point to some of the spread cells)
Figure 17B:
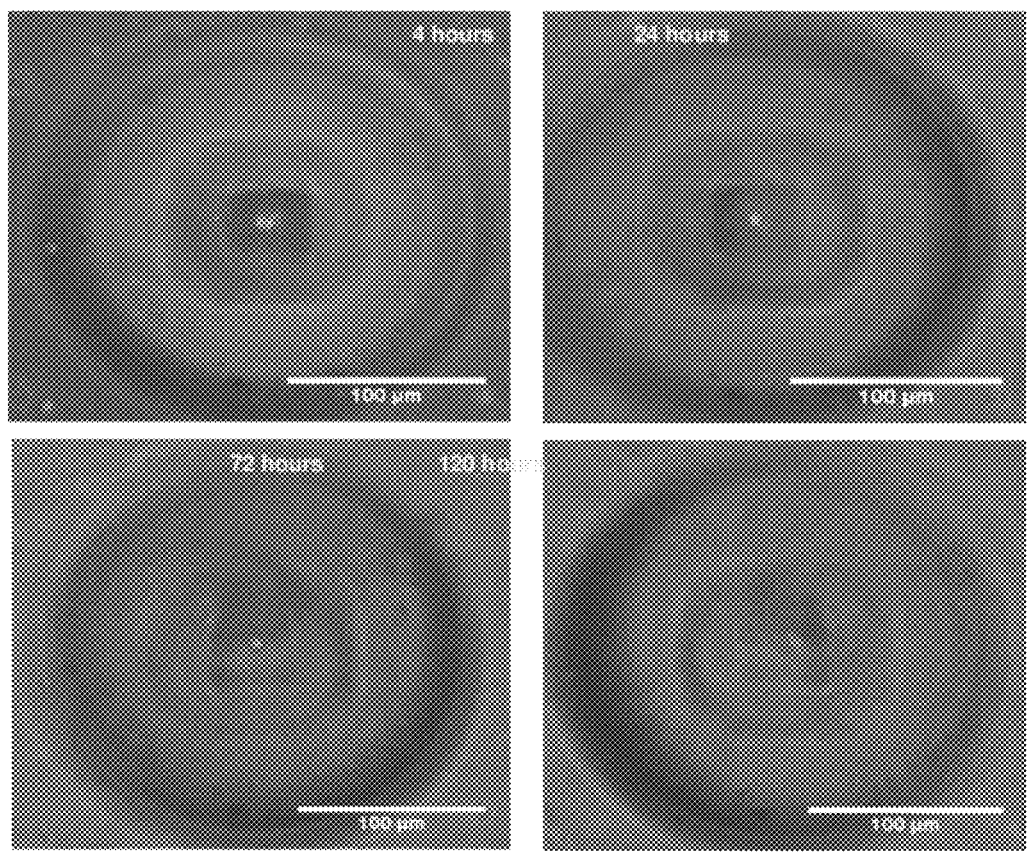
FIG. 17B is a picture of a single HaCaT cell was seeded in an untreated hydrophobic microbubble, where no proliferation or spreading is seen (even at 120 hours)

The compartmentalized architecture of the microbubbles and the ability to alter the PDMS surface chemistry are features that can be exploited in conducting single cell culture studies. A single YUSIK (metastatic melanoma) and a single HaCaT (non-tumorigenic keratinocyte) cell were cultured in plasma-treated hydrophilic and untreated hydrophobic microbubbles. Both cell types exhibit spreading and proliferation in plasma-treated microbubbles at 24 and 72 hours, respectively. In contrast, single cells seeded in untreated hydrophobic microbubbles do not spread or proliferate even after 120 hours. Results for a single HaCaT cell are shown in FIGS. 17A and 17B. Presumably, without cell-cell contacts, an ~8.1 nL microbubble is too large for a single cell to condition its environment to enable its adhesion and proliferation in a hydrophobic well. It will be shown below that increasing the number of cells in a similarly sized hydrophobic microbubble does promote cell survival and proliferation. It is interesting to note the strong effect surface energy has on cell adhesion and proliferation. This result demonstrates that hydrophilic microbubbles can be used to support proliferation of a single cell. Single cell survival in hydrophobic or hydrophilic microbubble is dependent to a large extent on cell type. The microbubble surface may further coated with bioactive substance to enable single cell survival. Using a vacuum-assisted coating technique, microbubble surfaces can be treated with a wide range of bioactive proteins to further alter and investigate single or multiple cell response.

Example 11

Forming Arrays of Homogeneously Sized 3D Cell Aggregates

Figure 18:
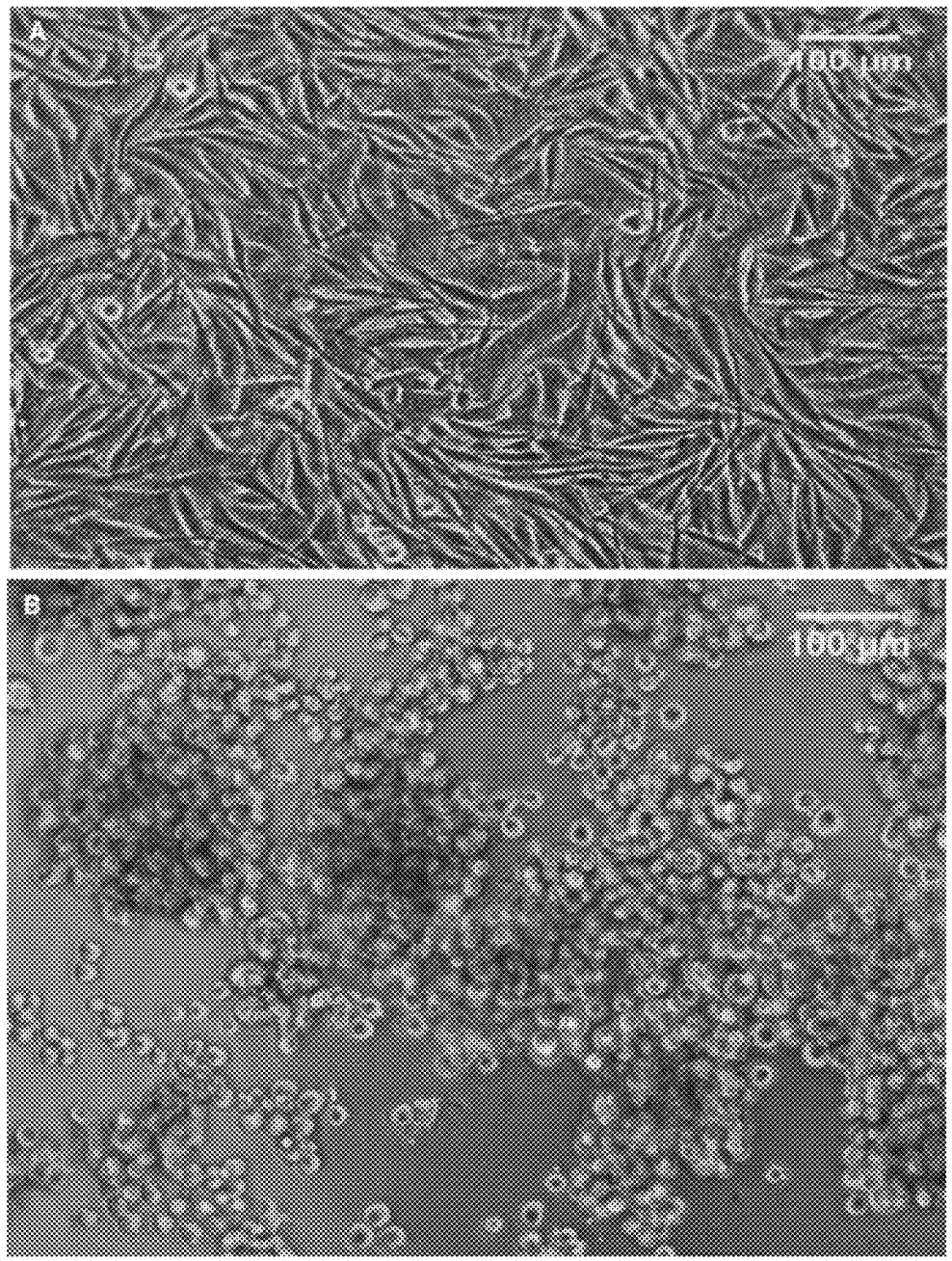
FIG. 18 is: A) a picture of bright field images of YUSIK metastatic melanoma cells grown on tissue culture plate ("TCP") adopt a spread morphology; and B) a picture of bright field images of YUSIK metastatic melanoma cells grown on planar PDMS do not spread but proliferate rapidly in 3D aggregates.
Figure 19:
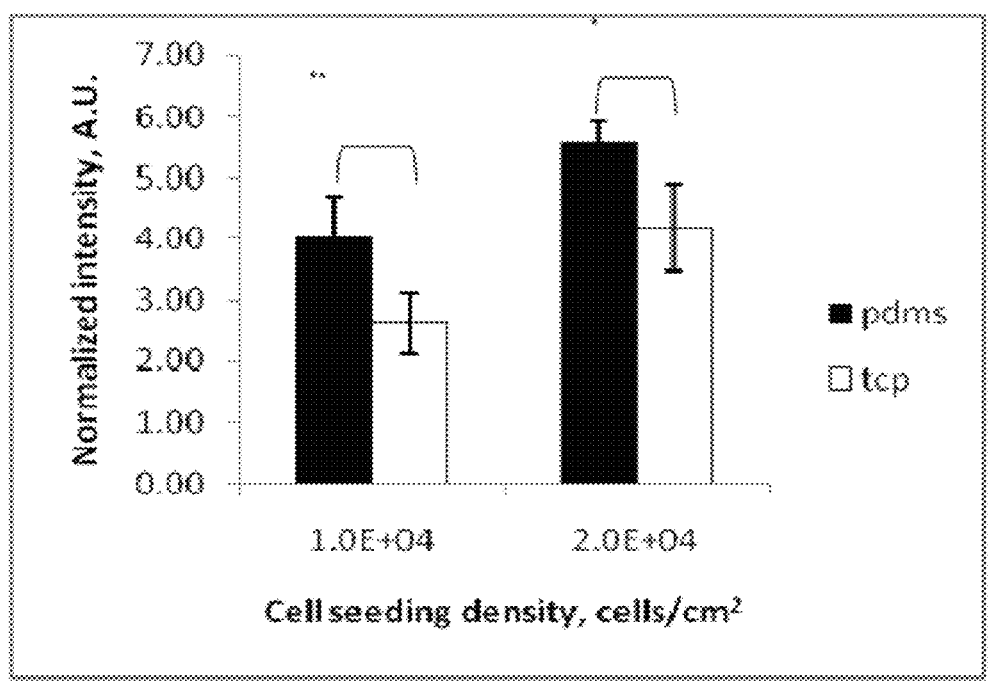
FIG. 19 is a graph of MTT assay results show the effect of the PDMS substrate on HaCaT cell proliferation relative to TCP (P-values<0.05 and <0.01 are indicated by (*) and (**), respectively)
Figure 20:
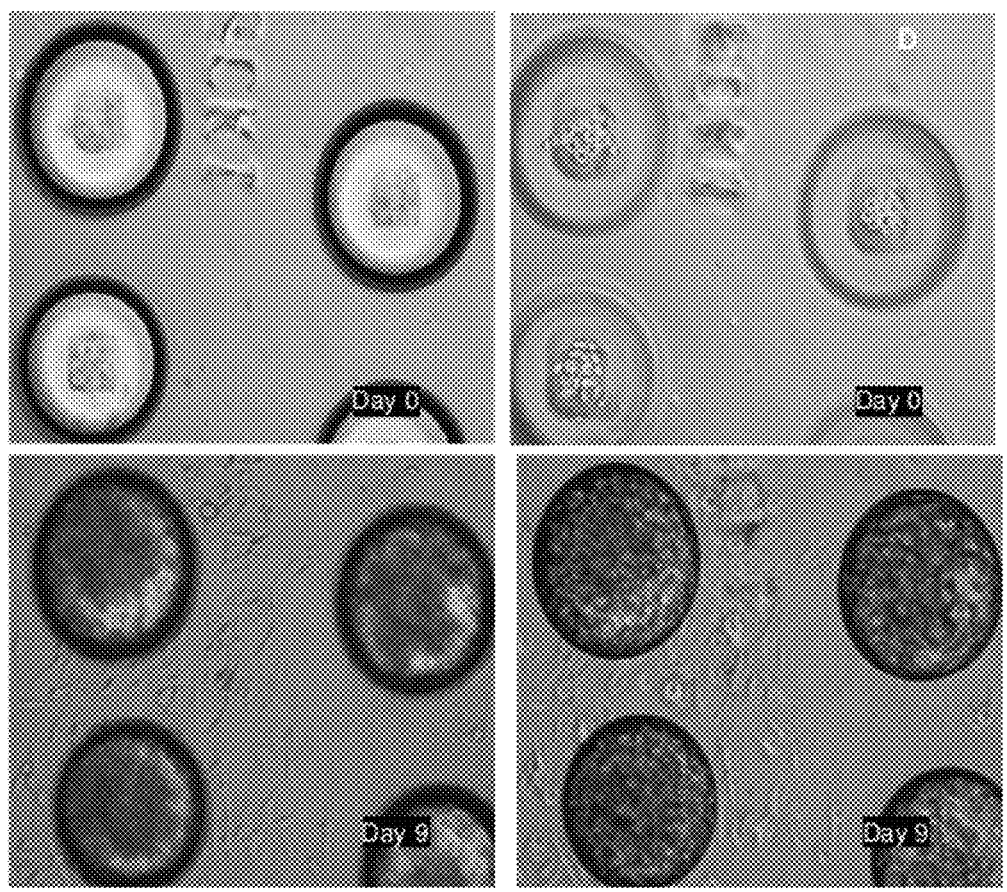
FIG. 20 is a group of bright field images of YUSIK metastatic melanoma cells following nine days of culture in microbubble wells, with focus at the microbubble square opening (left) and at the bottom of the microbubbles (right)

Cell-cell contacts and cell-substrate interactions are important biological stimuli that influence the survival and structural organization of cells. Cell adhesion to the extracellular matrix is a key factor in tissue homeostasis. Anchorage-independent cell proliferation is a recognized hallmark in metastases and tumorigenesis. It was observed that in vitro some cancer cells can proliferate on hydrophobic surfaces and adopt a colony morphology that differs from standard TCP. This is exemplified by YUSIK metastatic melanoma cells as shown in FIGS. 18-20. As shown in FIG. 18, on TCP YUSIK cells grow in a monolayer whereas on planar hydrophobic PDMS they do not spread into a monolayer but proliferate rapidly in 3D aggregates. Results from an MTT assay, depicted in FIG. 19, shows YUSIK cells are more active on PDMS than on TCP. Although the 3D morphology may be a more physiological relevant model for biological or chemotherapeutic studies; it is however, difficult to control the size of the aggregates on planar substrates. Microbubbles provide a simple means to confine the growth of homogeneously sized 3D cell aggregates in an array format. YUSIK cells were seeded (~10 cells per microbubble) in untreated hydrophobic microbubble wells and cultured at 37° C. and 5% $CO_2$ for 9 days. The clustered phenotype was adopted within 24 h of cell seeding and by day 6, YUSIK cells were observed to completely fill the wells. Multiphoton microscopy images of samples stained with calcein-AM (live, green) and propidium iodide (dead, red) show that cells throughout the filled microbubbles were viable (see FIG. 20). No evidence for necrotic cells was observed in these experiments. Cultures can be sustained for 14 days or longer, suggesting that microbubble cell culture is not limited by nutrient/waste exchange through the microbubble opening despite the ~250 µm diameter size of the microbubble compartment. Rectilinear microwells could in principle be used to confine the growth of 3D cell aggregates, but due to vertical diffusion gradients shallow wells with aspect ratio (depth/width) <1 would be needed and this would not allow for accumulation of soluble factors to influence colony phenotype as is demonstrated below.

Example 12

Cellular Response to Conditioned Microbubble Environment

For in vitro cell culture, the media volume to cell ratio is an important factor driving cell survival and proliferation. Cells rely on secretion of soluble factors (ie. growth factors, cytokines) to encourage adhesion and proliferation, particularly on uncoated substrates where cells must synthesize their own matrix or matrix is absorbed from media. When cells are seeded onto unfavorable substrates they may migrate to form cell-cell contacts to survival. The ability of the secreted factor concentration to rise to bioactive levels depends on the media volume to cell ratio and factor production rate. Here it is shown through simulation and experiments that microbubbles offer significant advantages over existing technologies to enable cells to condition and respond to their microenvironment.

Figure 21:
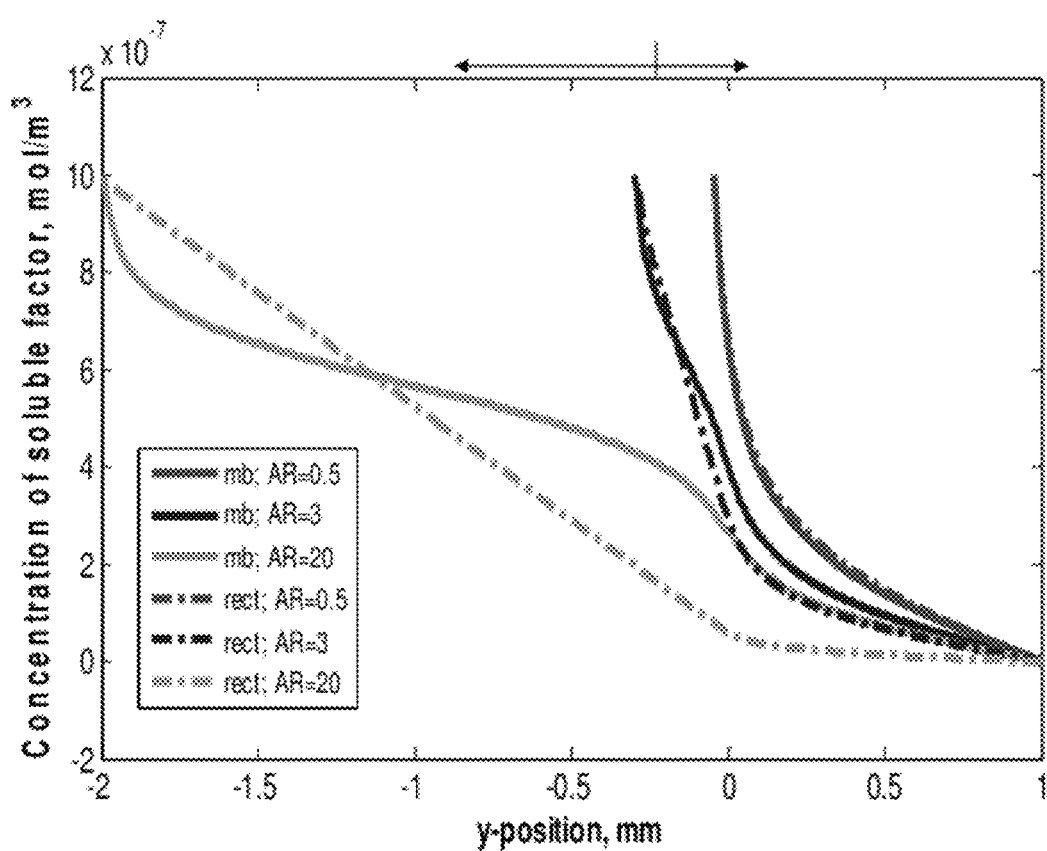
FIG. 21 is a graph of COMSOL simulation results contrasting the vertical concentration profile through microbubble and rectilinear wells as a function of well depth (y-position=0 corresponds to the well opening) for three aspect ratios.

Two dimensional mass transport simulations were conducted to simulate the diffusion of soluble factor secreted by a 10 µm cell placed at the bottom of both rectilinear and microbubble wells with varying aspect ratio. At equilibrium the concentration profiles at the well openings, vertically through the wells, and the integrated concentration in the wells were examined. Results, depicted in FIG. 21, show a general trend that for rectilinear wells the vertical concentration profiles are linear. In contrast, the architecture of the microbubble and its increased volume produce a varying concentration profile that depends on the aspect ratio. Shallow wells (aspect ratio <1) leak secreted factor out of the well and it is diluted in the bulk media reservoir. For aspect ratios >1, the concentration at the microbubble openings are higher than for rectilinear wells. Microbubbles show an advantage in allowing the secreted factor concentration to rise to higher levels and distribute more evenly throughout the microbubble at high aspect ratio. This is due to the increased volume which allows for development of a more shallow gradient and accumulation of soluble factor. These simulations support the notion that soluble factor can accumulate in microbubble wells and may be less prone to suffer from vertical diffusion limitations known to occur in high aspect ratio rectilinear wells. For this reason, microwells are typically fabricated for cell culture with aspect ratio <1. The simulations show that for shallow rectilinear and hemispherical wells (aspect ratio <1) soluble factor is readily lost to the external media reservoir (see FIG. 21).

Figure 22:
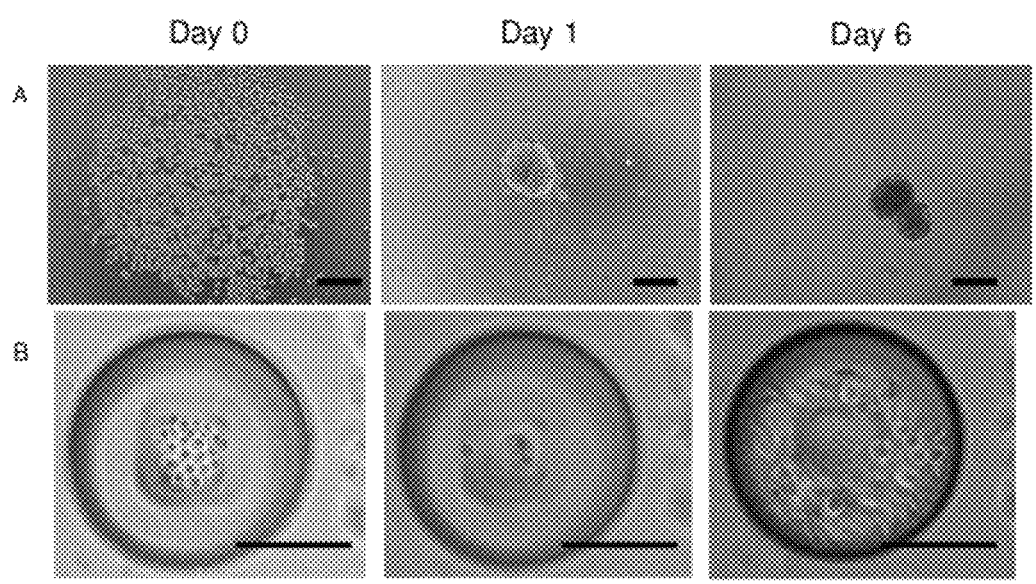
FIG. 22 contains pictures of HaCaT cells cultured as a function of time: (A) on untreated planar PDMS and (B) in an untreated hydrophobic microbubble (100 µm dia. square opening, 250 µm microbubble diameter), where cells were seeded at near equivalent density, ~1×10$^4$ cells/cm$^2$ (scale bars are 150 µm in length)

To provide experimental evidence that soluble factor secreted from cells seeded in microbubbles influence their response, studies were conducted of HaCaT cells seeded at near equivalent density (~1×10$^4$ cells/cm$^2$) in hydrophobic microbubble and on hydrophobic planar PDMS cast in 96-well TCP. Results show a fascinating change in HaCaT morphology in the microbubble that does not occur for cells culture on planar PDMS. On planar PDMS the cells migrate to form a single compact spheroid observed at ~24 h (see FIG. 22A). Due to the curvature of the microbubble HaCaT cells settle in a cluster at the bottom and in 24 h also form a single spheroid as shown in FIG. 22B. Interestingly, by 48 h HaCaT cells are observed to undergo a morphological transformation in the microbubble to adopt a sheet morphology. On planar PDMS this transition does not occur even after culturing for 6 days with or without media changes. The ability of HaCaT cells to undergo this morphology change is attributed to accumulation of soluble factor secreted by cells to bioactive levels in the microbubble. HaCaT spheroids are unable to condition their media in the 96-well format. By day 6, cells on planar PDMS begin to die and the spheroid dissociates. Studies are underway to investigate biochemical differences between the spread and clustered colony phenotypes, to identify the soluble factor, and to determine the dependence of this morphology transition on microbubble volume and the number of cells seeded in a microbubble.

Materials and Methods

Molding Microbubbles in PDMS Using a DRIE Silicon Wafer

To characterize the parameters that impact microbubble size a silicon mold using AutoCAD LT 2008 (Autodesk, Inc., USA) was designed that had mold openings arranged in three different spatially oriented arrays including 10×10, staggered, and alternating rows with opening shapes including circles, squares, triangles and rectangles. The diameters of the mold openings ranged from 20 to 200 µm. Five silicon wafer molds were produced from this mask (MEMS and Nanotechnology Exchange, USA). Three wafers were etched at different feature depths (25, 50 and 100 µm) using the Bosch deep reactive ion etch ("DRIE") process (Plasma Therm 770). These wafers were received following the Bosch DRIE process with the resist and hydrophobic coating intact. Using a Ramé-Hart Goniometer, a water contact angle ($\Theta_w$) of ~105° was measured. The remaining two wafers had etched depths of 50 µm. For these, the resist and hydrophobic coating were removed using a photoresist stripping process (Metroline) that rendered the wafer surface hydrophilic. One hydrophilic wafer ($\Theta_w$<20°) was received directly and the other was received following plasma deposition of a 0.2 µm polytetrafluoroethylene (PTFE) film ($\Theta_w$~120°).

Hydrophobic FDTS Coating Technique

A mixture of perfluorododecyl-1H, 1H, 2H, 2H-triethoxy-silane perfluorotetradecyl 1H, 1H, 2H, 2H-triethoxy-silane (FDTS; Gelest SIP6720.5) was diluted to a 2 mM solution in heptane. The received hydrophilic DRIE wafer was rinsed with ethanol and dried under $N_2$ gas. The wafer was submerged into 20 mL of the prepared FDTS solution in a glass Petri dish and placed on a rocker for 15 min. The coated wafer was removed from the solution and immediately dried under $N_2$ gas. Excess solvent was further removed by incubating the wafer at 100° C. for 30 min. This coating had a measured water contact angle ($\Theta_w$) of ~105°. The FDTS coated wafer was subsequently used as a mold for PDMS curing as described below.

PDMS Curing

The DRIE silicon wafers were used to mold PDMS microbubble chips with Dow Corning's Sylgard® 184 silicone elastomer kit in a 10:1 base to curing agent ratio (w/w). This pre-polymer was manually mixed with a pipette tip in a 50 mL conical tube for 30 seconds and then poured onto the silicon wafer molds. The mixture was allowed to self-level for 30 minutes at room temperature, and then cured at 100° C. for 2 h, except where noted for specific experiments. For studies performed in PDMS-coated 96-well plates, 50 jut of the PDMS pre-polymer was pipetted into each well and allowed to settle at room temperature for 30 min. The plates were then cured at 40° C. for 4 hours. This lower curing temperature was used to ensure that the tissue culture plate remained unchanged by the curing process.

PDMS Aeration Studies

Previous work suggested that the residual gases in the PDMS pre-polymer are essential for microbubble formation. Here, an in-depth investigation of the influence of the residual gas composition by aeration experiments using nitrogen, argon, carbon dioxide, helium pure gases (Air Gas, Inc., USA), and compressed air is provided. Excluding compressed air, these gases are known to make up a significant portion of the Earth's atmosphere: 78.1%, 0.9%, 0.04%, and 0.0005%, respectively. In this method, the PDMS pre-polymer was poured into a weigh boat and degassed in a bench-top vacuum chamber at ~690 mmHg relative to atmospheric pressure, for 30 min to remove the residual gas from the pre-polymer. Applying the degassed pre-polymer to the hydrophobic DRIE mold yielded the expected reverse mold. After degassing, the mixture was pipetted into 2 mL Eppendorf tubes and aerated with a gas at a pressure of 30 psi for 0, 0.5, 1, 2, 5, or 10 min. Then, the aerated samples were poured onto a wafer mold, allowed to self-level at room temperature for 30 min, and cured at 65° C. for 3 hours. It was shown (FIG. 15) that this reduced curing temperature does not significantly affect the diameter of the microbubble or the microbubble formation efficiency, defined below. PDMS film thickness was 1±0.1 mm as film thickness impacts microbubble size (see, e.g., FIGS. 25A and 25B). Increasing PDMS thickness produces larger bubbles with all other mold conditions kept constant.

Comsol Simulations of Gas Diffusion in Microbubbles

Two dimensional mass transport simulations were conducted using the Chemical Engineering Module of Comsol Multiphysics (Comsol, USA) to investigate (1) the effect of microbubble spacing on the diffusion of gases to microbubble structures and (2) the effect of the well aspect ratio on the diffusion of soluble factors produced by a cell cultured in the well. The Comsol Multiphysics modeling software was used to simulate gas diffusion from the bulk to 8 microbubbles with 100 micron openings spaced an increasing distance apart. Microbubble surfaces were set as sinks ($c=0$ mol/m$^3$) and all other surfaces were set as insulator boundaries (no concentration exchange). The bulk fluid was set at an initial concentration of $c=1$ mol/m$^3$. Steady state results showed the concentration of soluble gases around the microbubbles.

The diffusion of soluble factor secreted by a 10 μm cell (source) placed at the bottom of a well was also simulated. Specifically, differences in the concentration profiles between microbubbles and rectilinear wells with aspect ratios varying from 0.5 to 20 were investigated. The initial boundary conditions were set at the cell source ($c=1\times10^{-6}$ mol/m$^3$ or 1 nM) and the walls ($c=0$ mol/m$^3$). For the simulations, the free diffusion coefficient of epidermal growth factor (EGF) in dilute agarose ($D=16.6\times10^{-7}$ cm$^2$/s), which was determined by others, was used. The equations were solved to determine the concentration as a function of time until steady state was reached.

Analysis of Microbubble Formation in PDMS

Parametric studies were carried out on cured PDMS films cast onto each wafer from MEMS Exchange. Microbubble arrays were imaged using phase contrast microscopy (Olympus IX70 with QImaging Retiga EXL camera). Images were processed using ImageJ software (NIH, USA). Measurements of microbubble diameter were made from top-view images and results were compared to the cross-sectional diameter obtained by using a razor to cut the microbubble chip. The diameters measured by both methods were not statistically different ($p>0.05$).

Cell Culture Using PDMS Microbubble Technology

A metastatic melanoma cell line (YUSIK) and an immortalized keratinocyte cell line (HaCaT) were used to demonstrate advantages of microbubbles for cell culture. These cells were grown at 37° C. with 5% $CO_2$ in Opti-MEM reduced serum medium (Gibco 31985-070; Invitrogen Corp., USA) and DMEM (Gibco 11995-065, Invitrogen Corp., USA), respectively, and both were supplemented with 5% heat inactivated fetal bovine serum (Gibco 10082-147, Invitrogen Corp., USA) and 1% Penicillin/Streptomycin (Gibco 15140-122, Invitrogen Corp., USA). To prepare microbubble chips for cell culture, they were first soaked in ethanol solution for 10 seconds in a sterile hood and blown dry with nitrogen. The bottom of the microbubble chip was rendered hydrophilic by a 30 min. exposure to UV-ozone using a UV/Ozone Pro-Cleaner (BioForce Nanoscience, Inc., USA). This was done to keep the sample submerged in the media after seeding the cells. For experiments involving single cell culture only, an additional step was done in which the top of the microbubble chip was treated in gas plasma (March Plasmod) for 10 min. at 20 W to render surfaces hydrophilic. Then, the top surface was blocked with 50 μL of 1% bovine serum albumin (Hyclone SH30574.01, Thermo Scientific, USA) for 30 min.

To fill microbubble wells with cell culture media a vacuum-assisted coating (VAC) technique previously described was utilized. Briefly, PBS buffer (40 μL) was pipetted onto the top of a sterile 1.0×0.5 cm microbubble chip. It was then placed in a desktop vacuum chamber. Application of negative pressure (−690 mm Hg relative to atmospheric pressure) for 30 min depletes gases trapped in the microbubbles, causing a rapid injection of solution into the microbubble well. The primed microbubble compartment allows for its further use in cell culture described below.

A reagent exchange process was used to fill the microbubble with cell culture media. Here, the PBS buffer was removed and 50 μL of cell culture media was applied to the buffer primed microbubble chip surface. The buffer solution inside the microbubble mixes with the applied cell media. Pipette mixing facilitates the exchange. This process is repeated a second time to pre-condition the microbubble for subsequent cell seeding. Next, 50 μL of cell stock solution ($2\times10^5$ cells/mL) was applied to the microbubble chip for 15 minutes at a cell density of $2\times10^4$ cells/cm$^2$. Studies show that this process seeds on average 10 to 20 cells per microbubble. For single cell studies that are described below, cells were incubated for 1 min. at a cell density of $4\times10^4$ cells/cm$^2$. After seeding, the cell solution was removed from the chip by pipette and the chip was rinsed twice with 50 μL of new media. This step was done to gently remove cells that had deposited onto the PDMS surface. Next, the chip was transferred with sterile forceps to a new well in a 24-well plate pre-filled with 1 mL media and the plate was placed in an incubator at 37° C. and 5% $CO_2$. Culture media was exchanged every three to four days. Cells were cultured for over 14 days. A viability assay was performed using calcein-AM (live, green) and propidium iodide (dead, red) used at 1.0 μM and 1.5 μM, respectively. Fluorescence images were taken using a multiphoton microscope (Olympus Fluo-view FV 1000 AOM-MPM) with band pass filters 519/26 nm (OPI#08) and 565/40 nm (OPI#11) for calcein AM and propidium iodide, respectively.

Cell Proliferation Assay

To determine the extent of proliferation of cells grown on planar, hydrophobic PDMS surfaces compared to standard TCP, cells were seeded onto PDMS cured 96-well TCP. A colorimetric MTT assay, 3-(4,5-Dimethylthiazol-2-yl)-2,5-diphenyltetrazolium bromide), was used to detect mitochondrial enzyme activity using a Modulus II Multimode Microplate Reader (Turner BioSystems). The yellow MTT dye is reduced by mitochondrial reductase enzymes to form purple formazan crystals that can be dissolved and quantified by absorbance measurement which provides an indirect measure of cell viability based on metabolic activity. This test could not be carried out for cells cultured in the microbubble because the absorbance of the dye produced by the low concentration of cells is undetectable by currently available means. Proliferation in microbubbles can be indirectly inferred by the time it takes for cells to migrate out of the well onto the planar chip surface.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended embodiments.

What is claimed is:

1. A microfluidic device comprising:
a substrate comprising a first surface on one side of the substrate, a second surface on an opposite side of the substrate and a plurality of curvilinear spherical cavities formed in said substrate between the first and second surfaces, each of said plurality of curvilinear spherical cavities comprising an inner surface and an opening at the first surface to an exterior of the substrate, the opening having a first diameter, wherein the inner surface of each curvilinear spherical cavity curves outward from a rounded bottom located at a point furthest from said opening of said cavity to a maximum diameter, and then curves inward from said maximum diameter to said opening at the first surface, said maximum diameter being greater than said first diameter, and wherein material separating adjacent curvilinear spherical cavities consists essentially of the substrate.

2. The microfluidic device of claim 1, wherein the ratio of the maximum diameter to the first diameter is greater than 1.

3. The microfluidic device of claim 1, wherein the maximum diameter is approximately 150 to 350 microns.

4. The microfluidic device of claim 1, wherein the first diameter is approximately 60 to 200 microns.

5. The microfluidic device of claim 1, wherein the substrate is fabricated of a polymer.

6. The microfluidic device of claim 5, wherein the polymer comprises a polysiloxane, a carbon-based polymer or mixtures thereof.

7. The microfluidic device of claim 5, wherein the polymer comprises polydimethylsiloxane (PDMS), a polyacrlyamide, a polyacrylate, a polymethacrylate or a mixture thereof.

8. The microfluidic device of claim 1, wherein the curvilinear spherical cavities are provided in an array comprising cavities arranged in evenly spaced rows, cavities in staggered rows, cavities of the same size, cavities of the same shape, and/or cavities of varied sizes.

9. The microfluidic device of claim 8, wherein the cavities are spaced at a distance in a range of about two times the diameter of the opening of the cavities to about ten times the diameter of the opening of the cavities.

10. The microfluidic device of claim 1, wherein the curvilinear spherical cavities comprise a coating for selective capture of cells.

11. The microfluidic device of claim 10, wherein the coating provides a microenvironment beneficial for the culture of specific cells.

12. The microfluidic device of claim 11, wherein the coating comprises a biomolecule or biochemical.

13. The microfluidic device of claim 11, wherein the coating is selected from the group consisting of an antibody, a selectin, a collagen, a fibronectin, a chemoattractant, a signaling molecule, an antigen, a ligand, a biochemical, and combinations thereof.

14. The microfluidic device of claim 1, wherein the substrate further comprises one or more sensors embedded therein.

15. The microfluidic device of claim 14, wherein the sensors comprise optical sensors.

16. The microfluidic device of claim 14, wherein the one or more sensors are disposed in the curvilinear spherical cavities.

17. A microfluidic device comprising:
a polydimethylsiloxane (PDMS) substrate having a first surface on one side of the substrate, a second surface on an opposite side of the substrate, and a plurality of nearly spherical microcavities formed in the substrate between the first and second surfaces, the plurality of nearly spherical microcavities having an opening to an exterior of the substrate at the first surface, and wherein material separating adjacent nearly spherical microcavities consists essentially of the substrate.

18. The microfluidic device of claim 17, wherein the PDMS substrate is between 2.5 mm to 4.5 mm thick.

* * * * *